United States Patent [19]

Watanabe et al.

[11] Patent Number: 4,651,284

[45] Date of Patent: Mar. 17, 1987

[54] METHOD AND SYSTEM OF CIRCUIT PATTERN UNDERSTANDING AND LAYOUT

[75] Inventors: Toshinori Watanabe, Sagamihara; Tetsuya Masuishi, Machida; Koji Sasaki, Minato; Koichi Haruna, Yokohama; Noboru Horie, Takasaki, all of Japan

[73] Assignee: Hitachi, Ltd., Tokyo, Japan

[21] Appl. No.: 759,134

[22] Filed: Jul. 26, 1985

[30] Foreign Application Priority Data

| Jul. 27, 1984 | [JP] | Japan | 59-155257 |
| Jul. 27, 1984 | [JP] | Japan | 59-155258 |
| Jul. 27, 1984 | [JP] | Japan | 59-155259 |
| Jul. 27, 1984 | [JP] | Japan | 59-155261 |
| Aug. 8, 1984 | [JP] | Japan | 59-166050 |
| Aug. 10, 1984 | [JP] | Japan | 59-166350 |
| Aug. 10, 1984 | [JP] | Japan | 59-166349 |

[51] Int. Cl.$^4$ .................................... G06F 15/60
[52] U.S. Cl. .................................... 364/491
[58] Field of Search ................ 364/488, 489, 490, 491

[56] References Cited

U.S. PATENT DOCUMENTS

| 4,055,802 | 10/1977 | Panousis et al. | 364/490 X |
| 4,554,625 | 11/1985 | Otten | 364/491 X |

*Primary Examiner*—Michael L. Gellner
*Attorney, Agent, or Firm*—Antonelli, Terry & Wands

[57] ABSTRACT

The structure of a circuit which is given basic net data is stored as a pattern, the compliance of the basic net data with the pattern is checked by the separately prepared search function, and upon fulfillment of compliance the pattern is determined to exist within the circuit. The subcircuit to be recognized by elements is not directly defined, but is defined using an intermediate expression defined recursively so as to implement a search through pattern matching. In another form, one input terminal is specified, which is followed by a search for blocks having the terminal as an input node and the search for blocks having one of the output node strings as an input node recursively and cyclically until the output terminal is reached, so as to extract a string of nodes on which the signal is propagated. The system is provided with functions for recognizing and comprehending subsidiary structures of the circuit which are not defined by the entered net data. By the combinational use of the recognition result and the layout shape generating function prepared separately, the layout shape of the subsidiary structures are determined. Shapes of objects determined through the above process are laid out automatically, while avoiding obstacles, within a predetermined space. According to still another form, layout patterns of variable structure memorizing the object layout and wiring affair are prepared in advance, and a layout plan for a circuit having a hierarchical structure is created through the operation of embedding the circuit to be laid out into a pattern.

8 Claims, 40 Drawing Figures tr(tr₁, npn, n₁, n₉, n₁₀). ——————— 300
tr(tr₂, npn, n₂, n₈, n₁₀).
tr(tr₃, npn, n₆, n₁₀, n₁₁).

REGISTER (r₁, n₃, n₉). ——————— 302
REGISTER (r₂, n₃, n₈).
REGISTER (r₃, n₁₁, n₇).

CONNECT (n₈, n₄). ——————— 304
CONNECT (n₉, n₅).

INPUT (n₁). ——————— 306
INPUT (n₂).
INPUT (n₆).

OUTPUT (n₄). ——————— 308
OUTPUT (n₅).

Vcc (n₃). ——————— 310
VEE (n₇). ——————— 312

FIG. 4

```
COMPARATOR (TR1, TR2, R1, R2):——        ————————— 400 tr (TR1, TYPE1, BASE1, COL1, EM1), ⎤
tr (TR2, TYPE2, BASE2, COL2, EM2), ⎦ ——————— 402
TR1=1=TR2, ——————————————————————————— 404
EM1== EM2, TYPE1==TYPE2, ————————————— 406
REGISTER (R1, N11, N12), ⎤
REGISTER (R2, N21, N22), ⎦ ——————————— 408
( N11==N21, COL1==N12, COL2==N22 ; ⎤
  N11==N22, COL1==N11, COL2==N21 ; ⎥
  N12==N21, COL1==N11, COL2==N22 ; ⎬ ———— 410
  N12==N22, COL1==N11, COL2==N21 ). ⎦
```

FIG. 5

```
?— COMPARATOR (W, X, Y, Z).  ——————————— 500

W = tr1, ⎤
X = tr2, ⎥ ——————————————————— 510
Y = r1,  ⎥
Z = r2,  ⎦
```

DIVIDER (ANODE, CATHODE, (NODE)):-
    RESISTOR (ANODE, NODE),
    RESISTOR (NODE, CATHODE),.!.

DIVIDER (ANODE, CATHODE, [NODE 1. TAIL]):-
    RESISTOR (ANODE, NODE),
    DIVIDER (NODE, CATHODE, TAIL).

FIG. 29
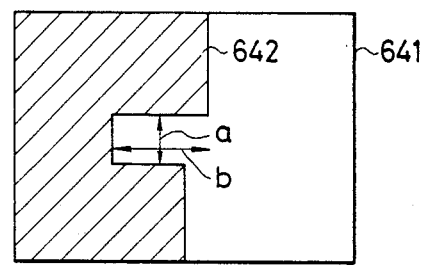
FIG. 30(a)     FIG. 30(b)
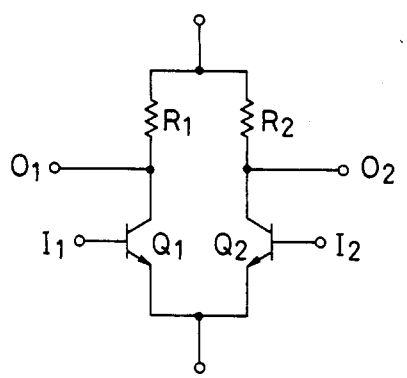   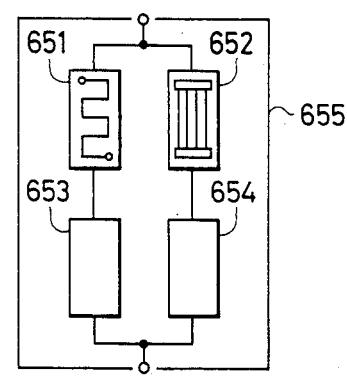

FIG. 31

:— RES-DESISN(1000, 5, 50, ANS) ——————————— 6400

ANS = RES-DESISN(1000, 5, 50, TYPE 1, (5, 60, 50, 1, 5, 5), 10) ——— 6402

:— RES-DESISN(1000, 20, 20, ANS) ——————————— 6404

ANS = RES-DESISN(1000, 20, 20, TYPE 2, (17, 18, 8, 1, 5, 5, 2, 2), 5) ——— 6406

:— RES-DESISN(10, 10, 10, ANS) ——————————— 6408

ANS = RES-DESISN(10, 10, 10, TYPE 3, (11, 11, 1, 1, 11, 5, 3, 2), 2) ——— 6410

FIG. 32

CONTACT(5, 5). ——————————————————— 6500

RES-COEF(1, 20). ——————————————————— 6510
RES-COEF(2, 10).

MIN-RES-WIDTH(2). ——————————————————— 6520

REPEAT(1). ——————————————————— 6530
REPEAT(2).
REPEAT(3).
REPEAT(4).
REPEAT(5).
REPEAT(6).
REPEAT(7).
REPEAT(8).
REPEAT(9).
REPEAT(10).

FIG. 33

RESISTER (TYPE 1, OHM, (X, Y, L1, W1, W2, W3)) :— ——————— 6600
    CONTACT (W2, W3), ———————————————————— 6602
    RES-COEF (W1, ROU), L1 IS OHM/ROU, X IS W2, Y IS L1+2*W3. —— 6604

RESISTER (TYPE 2, OHM, (X, Y, L1, W1, W2, W3, K, E)) :— ——————— 6610
    CONTACT (W2, W3),
    RES-COEF (W1, ROU),
    MIN-RES-WIDTH (E), REPEAT (K),
    LL IS OHM/ROU,
    LL>0,
    LLL IS LL−2*K*E,
    LLL>0,
    VERTICAL-LINE IS 2*K+1,
    L1 IS LLL/VERTICAL-LINE,
    L1>0,
    X IS (E+W1)*2*K+W2,
    Y IS L1+2×W3.

RESISTER (TYPE 3, OHM, (X, Y, L1, W1, W2, W3, K, E)) :— ——————— 6640
    CONTACT (WW, W3),
    RES-COEF (W1, ROU),
    MIN-RES-WIDTH (E),
    REPEAT (K),
    L1 IS K*OHM/ROU,
    W2 IS (K−1)*(E+W1)+WW,
    X IS W2,
    Y IS L1+2*W3.

FIG. 34

```
RES-DESISN(OHM, X-OBJ, Y-OBJ, ANS):—————————————————— 6700
    ASSERT(MEM(TYPE 0,-,99999)),———————————————————— 6702
    RESISTER(TYPE,OHM,(X,Y1L)),————————————————————— 6704
    ABS-DIFF(X,X-OBJ,Z1), ABS-DIFF(Y,Y-OBJ,Z2),
    DIFF IS Z1+Z2,—————————————————————————————————— 6706
    (DIFF<0,
    WRITE('DIFF='), WRITE(DIFF),NL,
    WRITE('TYPE. ETC='), WRITE((X,Y1L)),NL;TRUE),
    MEMORY(MEM(TYPE,(X,Y1L),DIFF)),————————————————— 6708
    FAIL.——————————————————————————————————————————— 6710

RES-DESISN(OHM, X-OBJ, Y-OBJ, ANS):—————————————————— 6740
    RETRACT-1(MEM(TYPE,LIST,DIFF)),
    ANS = RES-DESISN(OHM,X-OBJ,Y-OBJ,TYPE,LIST,DIFF),
    WRITE(ANS).

MEMORY(MEM):—————————————————————————————————————————— 6760
    MEM(-,-,DIFFMEM),
    MEN = MEN(-,-,DIFF),
    ((DIFF<DIFFMEM,RETRACT-1(MEM(-,-,-)),ASSERT(MEM));TRUE),!.

RETRACT-1(X):-RETRACT(X),!.————————————————————————— 6780

ABS-DIFF(X,Y,Z):-((X=<Y,Z IS Y-X);(Z IS X-Y)),!.—————— 6790
```

FIG. 35

| | | | | |
|---|---|---|---|---|
| BASIC FUNCTIONS | TREE STRUCTURE DEFINITION FUNCTIONS | BINARY | | |
| | TREE STRUCTURE DELETION FUNCTIONS | DELETE | | |
| | TREE STRUCTURE RETRIEVAL FUNCTIONS | RECALL | | |
| A.O.V RETRIEVING FUNCTIONS | DATA READING FUNCTIONS | LEVEL-1 READING FUNCTION | F GET-A | |
| | | LEVEL-2 READING FUNCTION | F GET-A-O | |
| | | LEVEL-3 READING FUNCTION | F GET-A-O-V | |
| | DATA WRITING FUNCTIONS | LEVEL-1 WRITING FUNCTION | F PUT-A | |
| | | LEVEL-2 WRITING FUNCTION | F PUT-A-O | |
| | | LEVEL-3 WRITING FUNCTION | F PUT-A-O-V | |
| | DATA DELETING FUNCTIONS | LEVEL-1 DELETING FUNCTION | F DEL-A | |
| | | LEVEL-2 DELETING FUNCTION | F DEL-A-O | |
| | | LEVEL-3 DELETING FUNCTION | F DEL-A-O-V | |
| | DATA CHANGING FUNCTIONS | LEVEL-1 CHANGING FUNCTION | F CHANGE-A | |
| | | LEVEL-2 CHANGING FUNCTION | F CHANGE-A-O | |
| | | LEVEL-3 CHANGING FUNCTION | F CHANGE-A-O-V | |

A.O.V DATA HANDLING SYSTEM COMPONENTS

METHOD AND SYSTEM OF CIRCUIT PATTERN UNDERSTANDING AND LAYOUT

BACKGROUND OF THE INVENTION

1. Field of the Invention

The present invention relates to a CAD (Computer-Aided Design) system for designing circuits, such as electronic circuits, and an automatic integrated circuit layout producing system, and more particularly to a method and system for understanding a circuit pattern and laying out circuit elements, employing a knowledge data base.

2. Description of the Prior Art

Function to understand a higher-level structure represented by nets on the basis of the basic net list information of a circuit has not been achieved by the conventional electronic circuit CAD. Accordingly, in laying out a differential amplifier in the layout of a bipolar linear circuit, for instance, it is simple for human to decide a layout conforming to the layout rule for the two component pair transistors (for example, a rule requiring the contiguous and opposite disposition of two pair transistors), whereas it is very difficult for a computer to decide the same. Prior art relating to such a function is described in detail in Jiry Soukup, "Circuit Lay-out", Proc. IEEE, vol. 169, No. 10, Oct. 1981.

If subcircuits to be recognized need to be defined directly by the elements, variations of the subcircuits with a slight difference must be defined directly and individually, which requires an enormous storage capacity and is difficult to apply to practical circuits of wide variation.

Furthermore, in a conventional automated electronic circuit layout method, the layout of an electronic circuit to be laid out is produced by selecting a layout shape corresponding to the elements of the electronic circuit among a shape data base storing layout shapes of circuit elements. Accordingly, it is impossible to use the layout shape data of the data base, when information for selecting the shape information among those of the shape data base is not given previously. Therefore, in determining the layout of a differntial amplifier, which is often employed in an analog circuit, for instance, a layout meeting a restrictive layout condition that the two pair transistors of the differential amplifier are to be disposed contiguously and oppositely can be determined only when a condition that the differential amplifier shown in a circuit diagram comprises two pair transistors is designated in the circuit diagram and the layout shape of the differential amplifier is provided in the shape data base.

When a layout is produced by a layout designer with reference to a circuit diagram, the layout designer understands the circuit to be a differential amplifier from the net list information of the transistors shown in the circuit diagram, even if the differential amplifier is not particularly indicated, and then the layout designer is able to produce an appropriate layout on the basis of his knowledge of the layout restrictions as to differential amplifiers. The layout shape of the differential amplifier can also be determined from the electrical characteristics of the differential amplifier.

It is desirable to provide a computer with the functions of the layout designer in order to improve the functions of a layout producing system.

Still further, a standard cell system (Saburo Muroga, "VLSI System Design", Wiley Interscience, 1982) has been a well-known automatic layout method for laying out a digital electronic circuit. According to this method, a plurality of the combinations of predetermined elements (transistor and resistance, a plurality of transistors, those elements of different constants) are provided in fixed shapes in a library as standard cells, and the combinations coinciding with the elements of the desired circuit to be laied out are selected and connected.

Recently, the necessity of analog-digital compounded LSIs has increased with the expansion of demand for LSIs, and the curtailment of design work load, particularly, that of the work load on layout designers, is a significant subject. In order to achieve such a subject, an automatic layout system for laying out analog circuits has been desired. However, differing from automated process for laying out a digital circuit, automated process for laying out an analog circuits is required to change the layout shape of circuit elements and parts so as to meet the characteristics of the elements and parts or the shape of the variable area for layout. Accordingly, the conventional standard cell system applicable to the digital system, in which the shapes of cells are fixed, is not applicable to laying out an analog circuit without modification.

Furthermore, in a conventional automatic layout system for laying out electronic circuits of the digital system, elements of known shapes to be laid out are arranged in a manner to reduce the wiring distance between the elements and the elements are interconnected by automatic wiring. When an increased number of elements need to be laid out, even a computer is unable to provide a satisfactory plan of layout, as there are numerous alternative modes of layout.

In a logic language, such as prologue, of knowledge information system for processing such a layout, one of the artificial intelligence techniques employs a system in which various conceptions are stored and retrieved in a mode of conception, "the property 0 of A is V", for example, as described in P. H. Winston, B. K. P. Horn; "LISP", Capt. 22, Addison-Wesley Publishing Co., 1981 and others. In case the layout shape of transistors is stored in laying out a circuit, when information, "The size of the shape of the base diffusion layer of tr1 is 4×5" is provided, [4, 5] can be stored with A=tr1, 0=base diffusion and V=shape.

On the contrary, when A and O is given, the value of V can be retrieve. In the above-mentioned example, an answer [4, 5] is given to a question, "What is the shape of the base diffusion of tr1?"

Thus, the retrieval system employing a form of conception represented by A, O and V uses only a simple retrieval keyword expression and a natural language, and hence this retrieval system is capable of storing and retrieving extremely numerous conceptions.

Such a useful A-O-V retrieval system will often be employed in information processing techniques for CAD.

A logic program such as artificial intelligence language Prologue, which has recently become a topic of the related arts, includes a back tracking mechanism and is capable of automatically retrieving an effective plan among various possible alternative plans. Accordingly, this logic program is deemed to occupy an important position in the future CAD techniques.

However, the logic program, in general, does not allow the use of global variables, namely, the common variables in FORTRAN, and hence it is usual to change the program described by the language while the program is executed, to achieve the A-O-V retrieval system on the logic program, which affects adversely to the processing efficiency.

SUMMARY OF THE INVENTION

It is an object of the present invention to provide a circuit structure understanding system capable of coping with various variations often appearing in actual circuits in recognizing, understanding and extracting a significant higher-level structure (subcircuit) from a net list information of the connection between the elements of an electronic circuit.

It is another object of the present invention to provide a method for recognizing and extracting a signal propagation path between the input and the output of the circuit from a net list information of the connection between the elements of an electronic circuit.

It is a further object of the invention to provide an automatic layout system capable of realizing a system for solving the problems of a large-scale layout having complex restrictions in the relation between the elements.

It is a still further object of the invention to provide a data transaction system in a logic program which achieves A-O-V retrieval or the like on a logic program for performing knowledge process such as mentioned above on a logic program.

In order to achieve the objects of invention, the present invention provides a method and system for understanding a circuit pattern, including a step of storing the structural pattern of the basic net data of an electronic circuit and a retrieval step at which retrieval is made to decide whether or not the memory stores a basic net data which conform to the structural pattern.

Furthermore, the present invention provides a method and system for laying out a circuit pattern, including a step at which a higher level structure consisting of the set of circuit elements is understood on the basis of given elements of the electronic circuit, given specifications of the elements and given wiring information for interconnecting the elements, and a step at which a layout shape corresponding to the understood high-level structure is produced.

BRIEF DESCRIPTION OF THE DRAWINGS

FIG. 4 is an explanatory diagram for assistance in explaining an embodiment of a structural pattern according to the present invention;

FIG. 5 is a diagram showing instructions for executing a circuit structure understanding program according to the invention and the resultant outputs;

FIG. 29 is an LSI layout on a substrate formed according to the present invention;

FIGS. 30(a) and 30(b) are explanatory illustrations of a cell combination according to the present invention;

FIG. 31 is an explanatory illustration of an input program and an output program each according to the present invention;

FIGS. 32 and 33 are explanatory illustrations of programs for producing a cell layout shape plan according to the present invention;

FIG. 34 is an explanatory illustration a cell layout plan selecting program according to the present invention;

FIG. 35 is an explanatory illustration of the component functions of an AOV retrieval system, in a seventh embodiment, according to the present invention.

DESCRIPTION OF THE PREFERRED EMBODIMENTS

A first embodiment of the present invention will be described hereinafter in connection with the accompanying drawings including FIG. 1.

Figure 1:
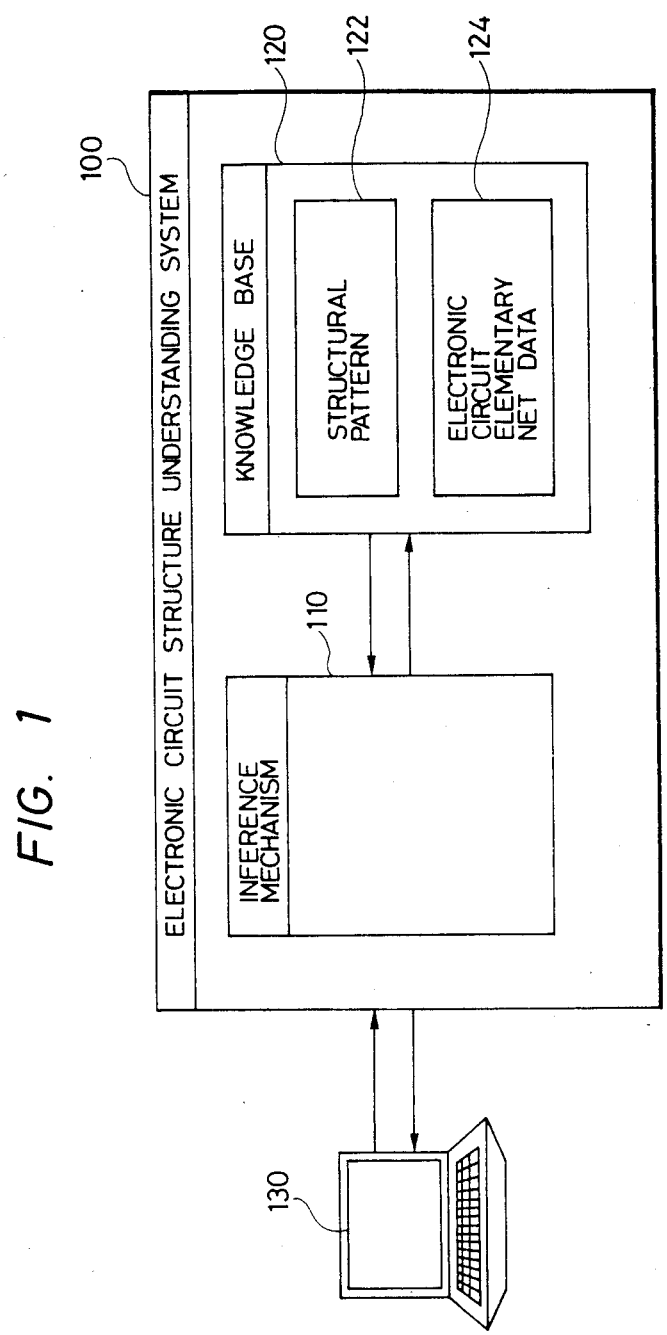
FIG. 1 is a block diagram showing the functional constitution of an electronic circuit structure understanding system according to the present invention.

FIG. 1 shows the constitution of a system embodying the present invention. In FIG. 1, indicated at 100 is an electronic circuit structure understanding system, at 110 is an inference mechanism, at 120 is a knowledge base internally containing a structure pattern 122 and an electronic circuit elementary net data 124, and at 130 is a terminal equipment.

This embodiment will be described on an assumption that the present invention is embodied on the prologue language for artificial intelligence. The prologue language is advantageous since the inference mechanism 110 can be realized by the immanent inference mechanism of the prologue language. The prologue language and the inference mechanism thereof are described in detail in "Clocksim & Mellish 81; Programming in Prologue, Springer-Verlag, 1981", and hence the description thereof will be omitted.

Figures 2, 3:
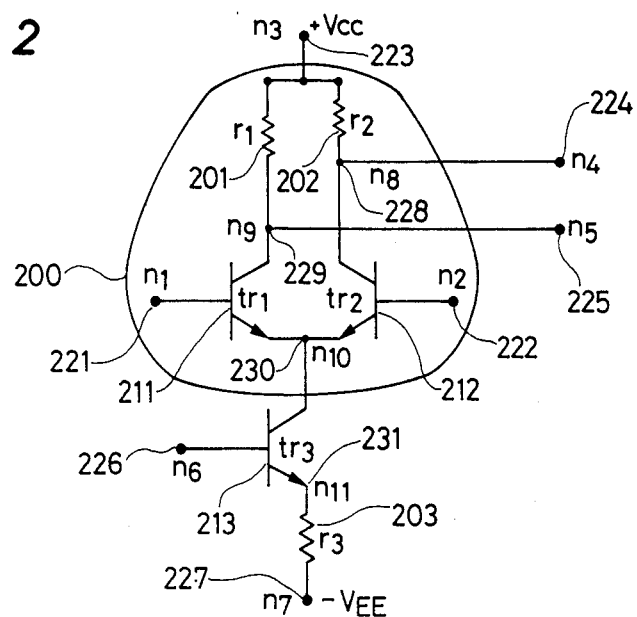
FIG. 2 is a diagram of a conventional circuit, provided for information in explaining the embodiments of the present invention.
FIG. 3 is an explanatory diagram of basic net list information of the circuit of FIG. 2, for assistance in explaining the present invention.

FIG. 2 shows a concrete example of an electronic circuit. In FIG. 2, indicated at 200 is a differential amplifier, and at 211, 212 and 213 are npn transistors. An electronic circuit structure understanding system will be described hereunder with reference to this circuit shown in FIG. 2.

FIG. 3 shows an example of the expression of the basic net list information of the electronic circuit of FIG. 2 on the prologue language. This expression corresponds to the contents of the electronic circuit elementary net data 124 of FIG. 1.

In FIG. 3, a reference numeral 300 indicates the existence of an npn transistor designated as $tr_1$ and the base, the collector and the emitter are connected to nodes $n_1$, $n_9$ and $n_{10}$ respectively. FIG. 3 gives description similar to that for the npn transistor $tr_1$ for two other transistors.

In FIG. 3, areference numeral 302 indicates the existence of a resistance $r_1$ and the nodes thereof are $n_3$ and $n_9$. Similar description is given to two other resistances. In FIG. 3, a reference numeral 304 indicates that nodes $n_8$ and $n_4$ are interconnected. Similar description is given to other connections. In FIG. 3, a reference numeral 308 indicates that a node $n_4$ is an output node. Similar description is given to a node $n_5$.

In FIG. 3, a reference numeral 310 indicates that a node $n_3$ is $V_{CC}$ and a reference numeral 312 indicates that a node $n_7$ is $V_{EE}$.

FIG. 4 is a structural pattern for understanding the structure of the differential amplifier 200 of the circuit diagram shown in FIG. 2 and structural pattern is an example of the contents of the structural pattern 122 of FIG. 1. When a structure other than the differential amplifier needs to be understood, similarly to a differential amplifier which will be described hereunder, a pattern for structure understanding is produced and the same is provided in the structural pattern 122 of the knowledge base of FIG. 1.

In FIG. 4, a reference numeral 400 indicates that a structure having four variables, i.e., TR1, TR2, R1 and R2 (capitalized words are variables, while those of small letters are constants), as the differential amplifier. TR1 and TR2 are variables to which actual transistor designations are assigned after structural understanding, while R1 and R2 are variables to which resistance designations are assigned. This example is a pattern for understanding a differential amplifier consisting of two transistors and two resistances. In a part indicated by 400, a mark ":-" separates the right-hand side and the left-hand side; the comparator (TR1, TR2, R1, R2) is the left-hand side and 402 to 410 are the right-hand side. The left-hand side is the object of structural understanding (a differential amplifier in this example) and the right-hand side represents preconditions for the left-hand side to be true.

A reference numeral 402 indicates that a differential amplifier needs to have two transistors. The transistors are designated by variables TR1 and TR2, which are the same as the variables TR1 and TR2 of the left-hand side. A reference numeral 404 indicates that the actual designations of the two transistors of 402 indicated by the designations TR1 and TR2 need to be different. A reference numeral 406 indicates that the emitters of the two transistors need to be connected to one and the same node (EM1-EM2) and that the respective types of the two transistors need to be the same (TYPE 1=TYPE 2).

A reference character 408 indicates that two resistances need to be provided.

A reference numeral 410 indicates that the nodes of the two resistances need to meet one of the four conditions (";" is a logical OR symbol). The first condition indicates that a real node indicated by the node variable N11 of one of the resistance and a real node indicated by the node variable N21 of the other resistance are the same, a real node indicated by a resistance node variable N12 and a real node indicated by the collector node variable COL1 of the transistor tr1 are the same, and a real node indicated by the collector node variable COL2 of the transistor tr2 and a real node indicated by the node variable N22 of the resistance are tha same. Three other definitions shown in FIG. 4 are the same as the above-mentioned definition, therefore, the description thereof will be omitted.

FIG. 5 shows a manner of giving instructions from the terminal of FIG. 1 for the structural understanding of a differential amplifier. A reference numeral 500 indicates an instruction, "Understand the structure of a differential amplifier having variables X, Y and Z" described in the prologue language. When this instruction is given, the inference mechanism 110 of FIG. 1 accesses information shown in FIG. 4 among the information included in the knowledge base, then finds a condition that meets the first condition tr (TR1, TYPE 1, BASE1, COL 1, EM1) of the right-hand side from the basic net list information of the electronic circuit shown in FIG. 3, and then assigns the information to be matched to the variables TR1, TYPE 1, BASE 1, COL 1 and EM 1. In this example, the first one among the conditions 300 of FIG. 3 matches the first condition tr of the right-hand side and $tr_1$, npn, $n_1$, $n_9$ and $n_{10}$ are assigned to the variables respectively. Details of this procedure are described in the above-mentioned literature "Clocksin & Mellish 81", and hence the detailed description thereof will be omitted. Thereafter, other conditions of the right-hand side are subjected to matching with the contents of FIG. 3 sequentially while the variables once assigned to constants are fixed to decide the values of the variables meeting all the conditions of the right-hand side. In case of failure, another matching object that meets the prior condition is searched for automatically. Finally, as indicated at 510 in FIG. 5, a conclusive output indicating that the differential amplifier consisting of two transistors $tr_1$ and $tr_2$, and two resistances $r_1$ and $r_2$ is found in the basic net list information of the electronic circuit of FIG. 3 is displayed. That is, the existence of the differential amplifier is understood by the computer.

Structural understanding of various electronic circuits can be achieved by changing the contents of the condition 124, while the contents of the structural pattern 122 of FIG. 1 are fixed.

The present invention has been described with reference to a differential amplifier, however, the present invention is capable of understanding optional structural patterns on the basis of the above-mentioned spirit, provided that net patterns specific to electronic circuits (structural patterns) or high-level structures are stored previously in the knowledge base.

According to the present invention, the basic net list information of an electronic circuit as shown in FIG. 3 is given to make a computer achieve the understanding of upper level semantics.

Application of the present invention to an electronic circuit layout CAD system enables a computer to execute an operation, "Place the two pair transistors of a differential amplifier adjacently and symmetrically.", which is possible when human produces a layout with reference to FIG. 2, when the basic net list information of electronic circuits is given, and thereby a layout of a higher grade as compared with the conventional layout can be produced.

Although there are various net patterns or rules specific to electronic circuits, other layouts of electronic circuits can be determined in the same manner as described hereinbefore within the scope and sprit of the present invention.

[Second Embodiment]

A second embodiment of the present invention will be described hereinafter.

Figure 6:
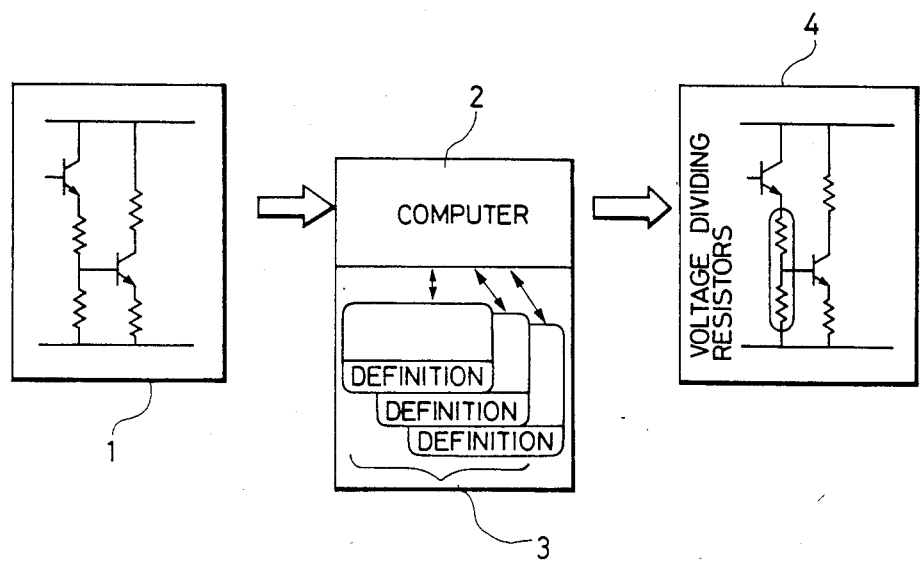
FIG. 6 is a conceptional illustration showing the general constitution of a second embodiment of the present invention.

FIG. 6 shows a constitution employing a computer, embodying the present invention. A circuit net data 1 is given to the computer 2 as an input. The computer 2 collates the input with internally stored subcircuit definitions 3 and provides a subcircuit 4 meeting the definition. The present invention is characterized by the recursive collation of the input with the definitions 3 for flexible collation.

Figure 7:
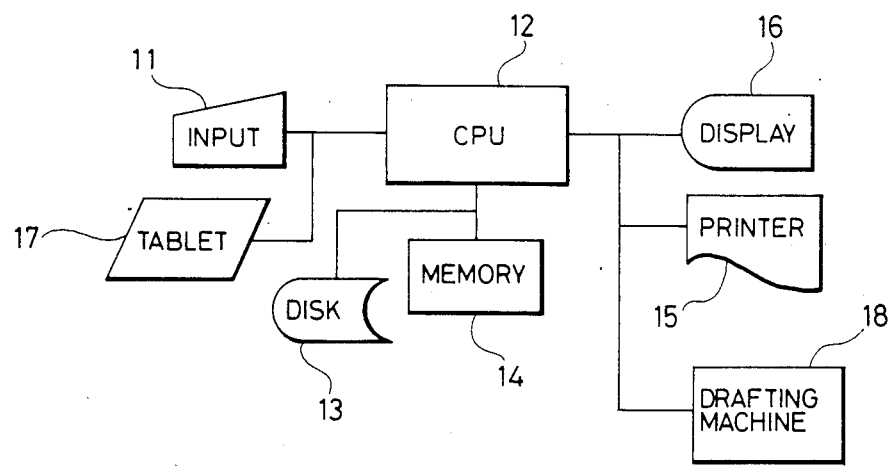
FIG. 7 is a block diagram showing the operational environment of the present invention.

FIG. 7 shows an exemplary hardware environment for carrying out the operations of the present invention. An input pattern given to a CPU by means of a keyboard entry unit and a pattern input tablet is collated with the definitions 3 by the CPU, and then the CPU gives an output to a drafting machine 18 and the like. Pattern files are stored also in a disk unit 13 or the like, and hence it is possible to provide an output by a printer or a display unit.

Figures 8, 9:
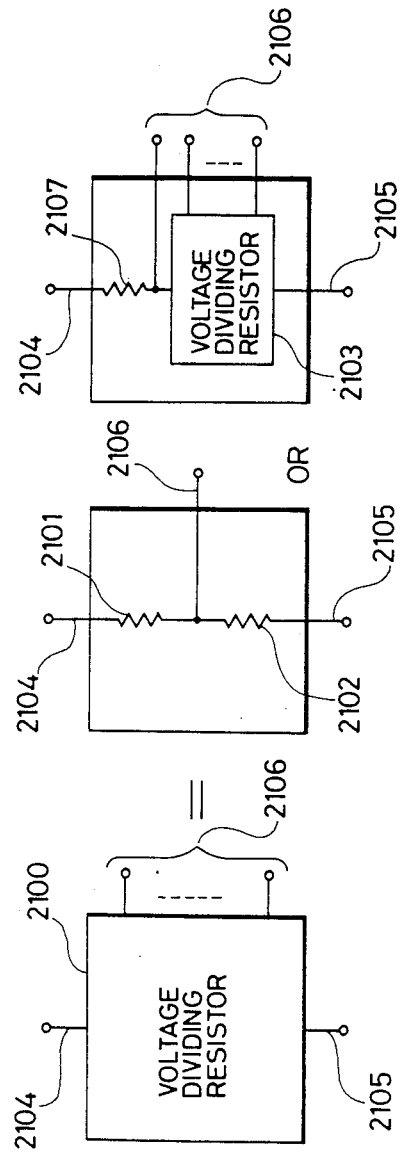
FIG. 8 is an explanatory illustration of an embodiment of the present invention.
FIG. 9 is a view showing the source flow showing operations for recognition and extraction according to the present invention.

FIG. 8 shows the recursive definition of a subcircuit, i.e., a voltage dividing resistor. The voltage dividing resistor 2100 is defined as a circuit having a serial connection of resistances 2101 and 2102, an anode terminal 2104, a cathode terminal 2105 and a voltage dividing terminal 2105, or as a circuit having a serial connection of a resistance 2107 and a voltage dividing resistor 2103, an anode terminal 2104, a cathode terminal 2105 and a voltage dividing terminal 2106. In this embodiment, since recursive definition is made, a voltage dividing resistor can be recognized and extracted regardless of the number of the resistances. A source list for the recursive definition of the voltage dividing resistor for the actual extraction of the voltage dividing resistor by the prologue language is shown in FIG. 9. (Refer to "Clocksin & Mellish (translation by Nakamura)" Prologue Programming, Japan Computer Assoc., for prologue language).

Figure 10A:
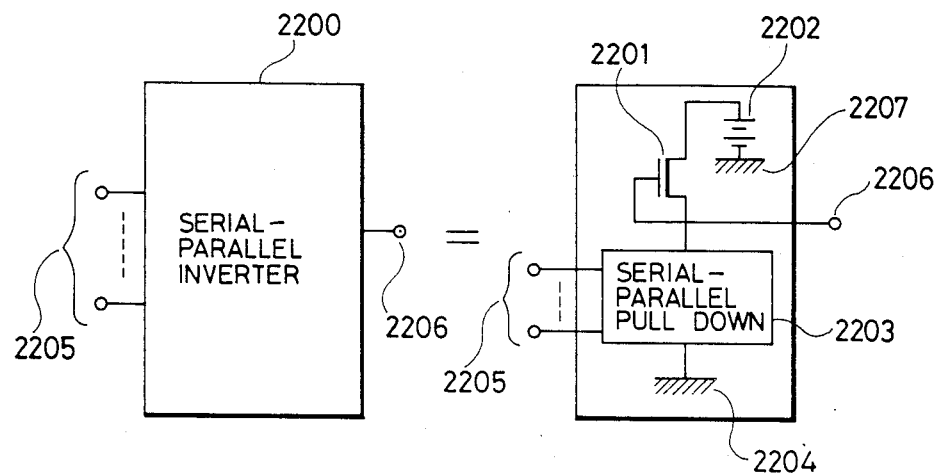
FIGS. 10(a) and 10(b) are explanatory illustrations of an embodiment of the present invention.
Figure 10B:
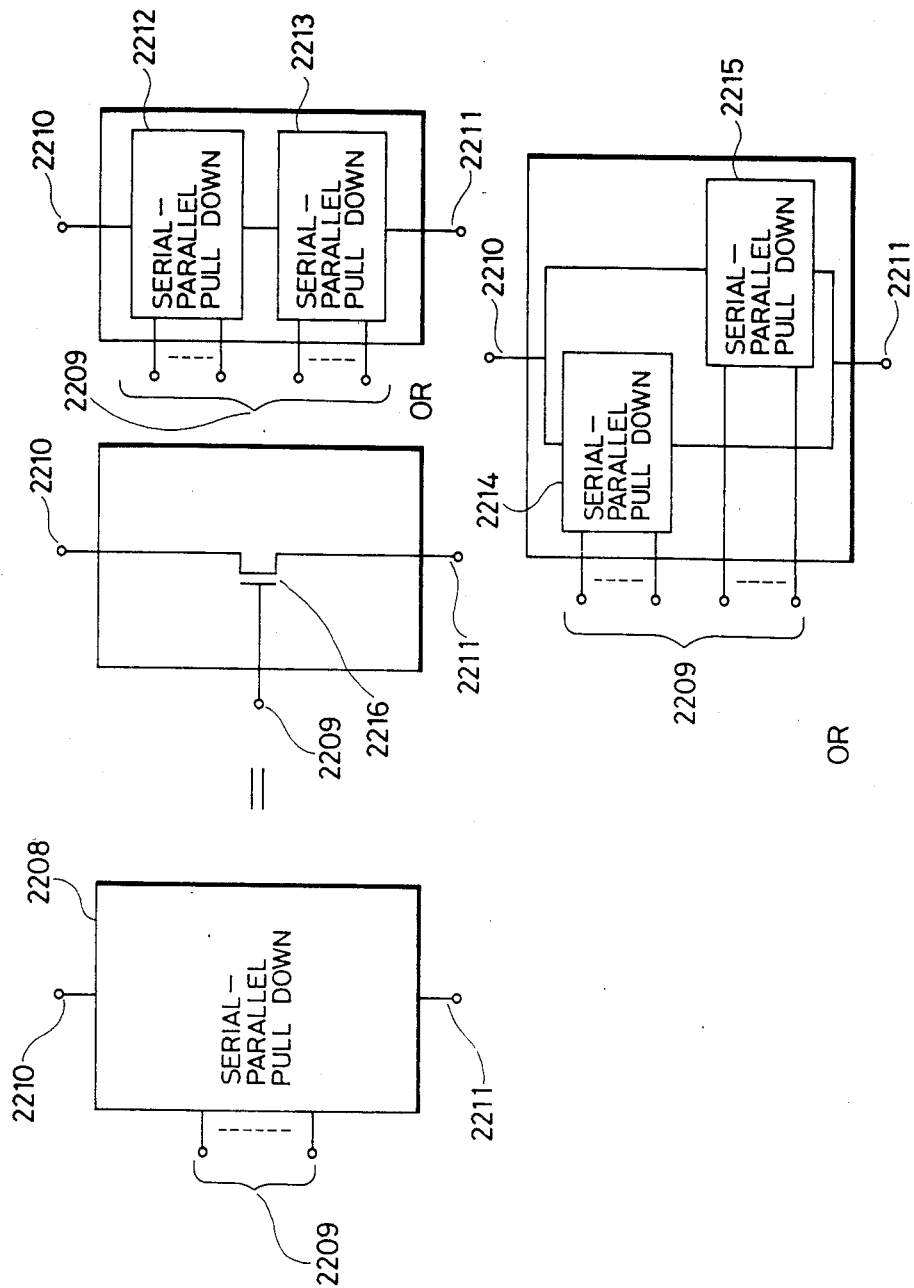

FIG. 10 shows a definition of a logical operation circuit having an optional combination of an NAND logic and a NOR logic (designated as "serial-parallel inverter") by the use of serial-parallel pulldown, a recursively defined nonterminal symbol. The serial-parallel inverter 2200 has a depletion-mode MOSFET 2201 connecting a power source 2202 to a serial-parallel pulldown 2203 connected to earth 2204, an input terminals 2205 and an output terminal 2206 as shown in FIG. 10(a). A serial-parallel pulldown 2208 is a circuit having an enhancement-mode MOSFET 2216, an anode terminal 2210, an input terminal 2209 and a cathode terminal 2211, or a circuit having a serial connection of serial-parallel pulldowns 2212 and 2213, an anode terminal 2210, input terminals 2209 and a cathode terminal 2211, or a circuit having a parallel connection of serial-parallel pulldowns 2214 and 2215, an anode terminal 2210, input terminals 2209 and a cathode terminal 2211, as shown in FIG. 10(b). Since this embodiment is recursively defined, this embodiment is able to recognize and extract a NMOS interver of an optional logic.

Thus the second embodiment of the present invention is capable of recognizing and extracting a subcircuit corresponding to the variation of circuits.

[Third Embodiment]

A third embodiment of the present invention will be described hereinafter with reference to FIGS. 11 to 14. The object of this embodiment is a subcircuit of high input impedance and low output impedance which can be incorporated into a circuit network as it is without deteriorating the characteristics thereof.

Figure 11:
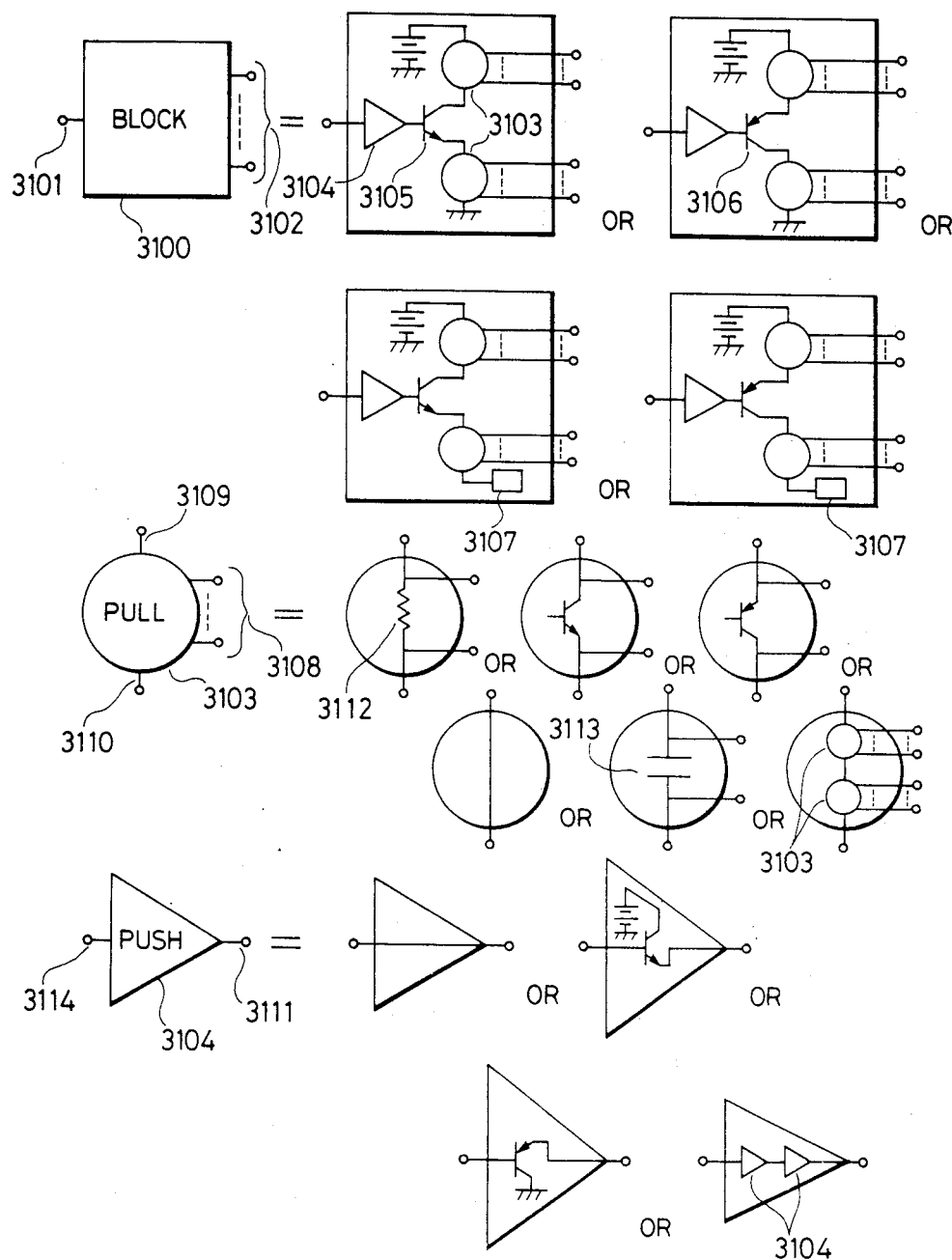
FIG. 11 is an explanatory illustration showing the definition of blocks of a third embodiment of the present invention.
Figure 12:
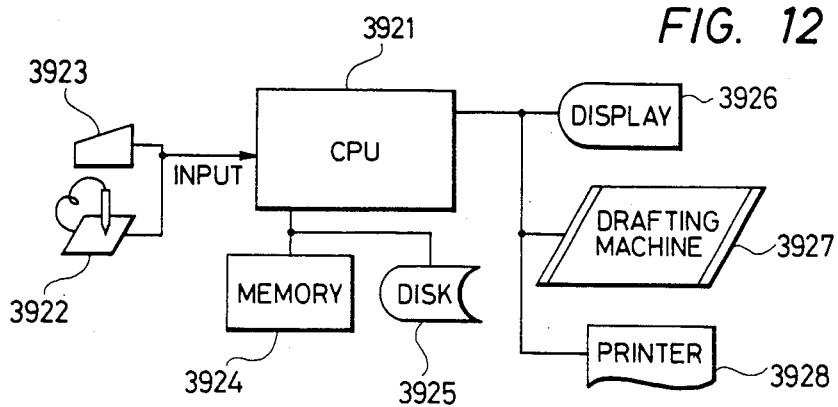
FIG. 12 is a block diagram showing an exemplary a hardware environment for carrying out the present invention.

FIG. 11 also shows defining a block 3100 by the use of a pull 3103 and a push 3104, namely, recursively defined nonterminal symbols. The block 3100 has an input node 3101 and an array of output nodes 3102 and is defined, as shown in FIG. 11, by pulls 3103, transistors 3105 and 3106 and a push 3104. Indicated at 3107 is an output terminal of the circuit. The pull 3103 is defined as a circuit having a resistance 3112, transistors 3105 and 3106, a condenser 3113, an anode node 3109, a cathode node 3110 and output nodes 3108, or a circuit having a serial connection of pulls. The push is defined as a circuit having the transistors 3105 and 3106 connected as shown in FIG. 11, an input node 3114 and an output node 3111, or a circuit having a serial connection of pushes. The various definitions of these blocks are stored in a memory and the relation between the net and the blocks are defined beforehand. FIG. 12 shows a hardware environment for carrying out the present invention. The above-mentioned definitions are stored in a memory 3924 and a magnetic disk memory 3925. A circuit to be extracted is entered into a CPU 3921 by means of a keyboard entry unit 3923 or a tablet 3922. The output of the CPU 3921 is given to a display unit 3926 a drafting machine 3927 or a printer 3923, according as occasion demands.

Figure 13:
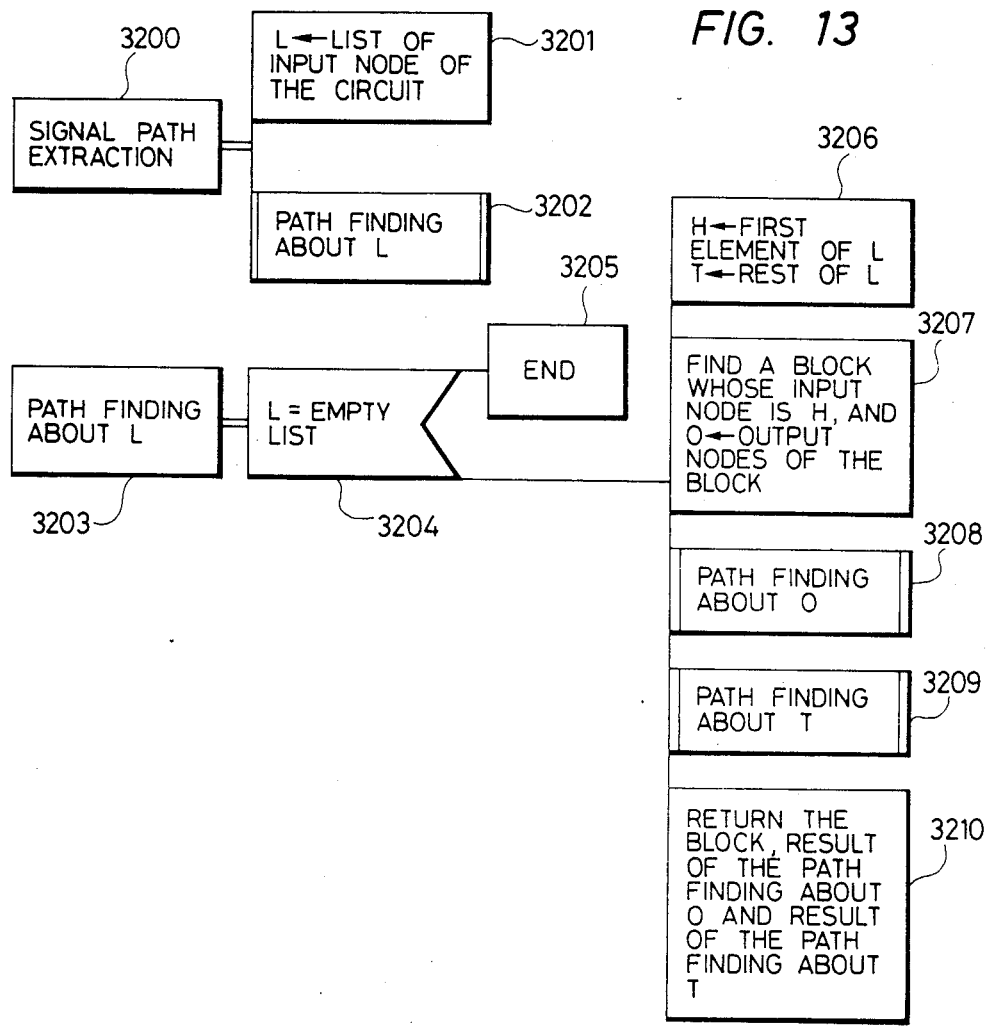
FIG. 13 is a PAD flow chart of the signal propagation line extraction procedure of the third embodiment of the present invention.

The block defines as shown in FIG. 11 has a single input node and multiple output nodes. Therefore, repetition of a procedure comprising selecting an input node of the circuit as an input node, retrieving the block and retrieving one block by employing one of the obtained output nodes as an input node, until extraction becomes impossible achieves the search for the signal propagation path of the circuit. A PAD diagram (flow chart) of the procedure for extracting a signal propagation path from such a circuit through the depth first search of the block is shown in FIG. 13. (Refer to "Application of PAD (Problem Analysis Diagram) to the Design and Production of Programs"; Mimura et al., for PAD). Signal propagation path extraction 3200 is a pah search (3202) about L by substituting the list of input node of a circuit for L (3201). Path search about L (3203) is ended (3205) if L is an empty list (3204), if not (3204), the first element of L is held as Head and the rest of the elements of L are defined as Tail (3206), a block whose input node is Head is extracted, the output nodes of the block are defined as Outputs (3207), recursive path search is carried out about the Outputs (3208), recursive path search is carried out about the Tail (3209), and the block extracted at Step 3207, the block list extracted at Step 3208 and the block list extracted at Step 3209 are put together into a single block list and returned.

Thus the present invention uses blocks of the same kind for defining a block and the same path searching procedure as used for the preceding path searching is employing in the succeeding path search for the rest of the paths, and hence the path search of the present invention is recursive.

Figure 14:
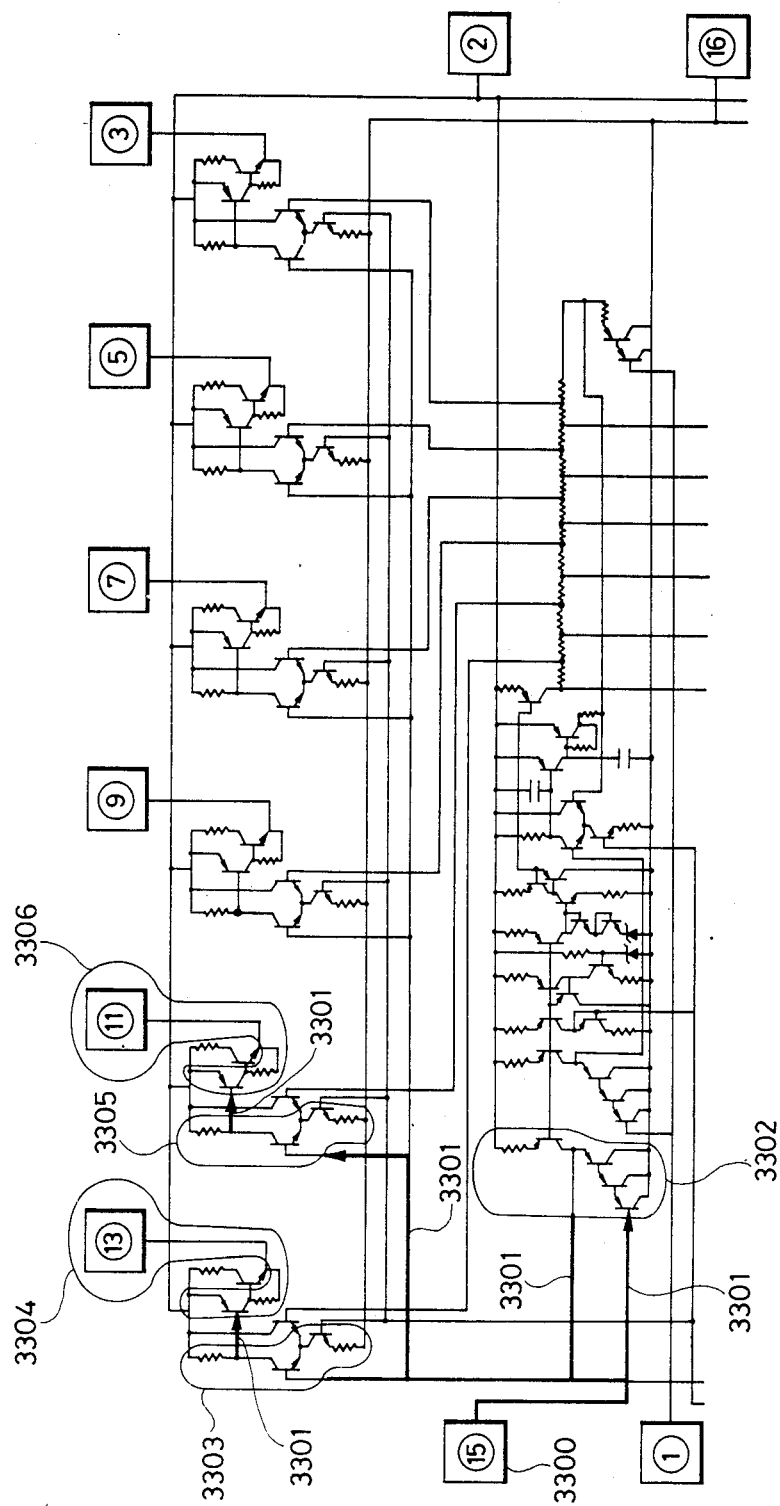
FIG. 14 is a circuit diagram showing the results of exemplary signal propagation path extraction performed according to the present invention.

The result of application of the present invention to an actual circuit is shown in FIG. 14. A signal propagation path 3301 was recognized and extracted by extracting a block 3302 having an input terminal 15, 3300 as an input node, extracting a block 3303 employing the output node of the block 3302 as an input node, and extracting blocks 3304, 3305 and 3306.

The embodiment has been described as applied to a computer software, however, the algorithm of the present invention can partially be carried out by a microcomputer or a special purpose hardware, or can be realized by a device.

The third embodiment of the present invention is capable of extracting a signal propagation path only from the net list information of the circuit.

[Fourth Embodiment]

A fourth embodiment of the present invention will be described hereinafter with reference to FIGS. 15 to 19.

Figure 15A:
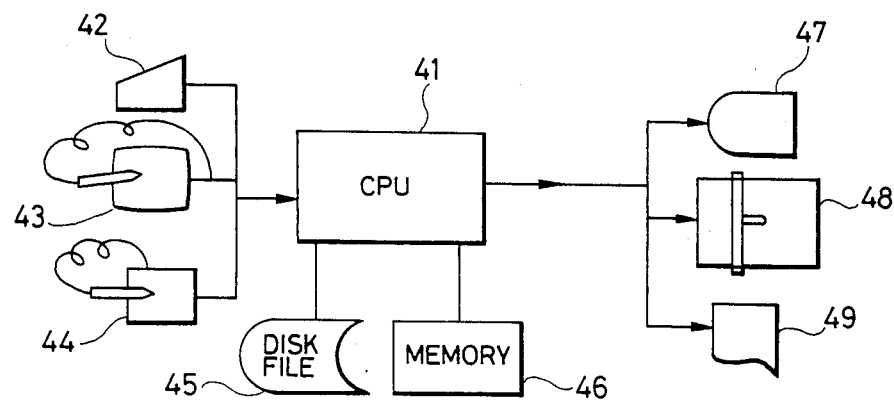
FIGS. 15(a) and 15(b) are block diagrams showing the constitution of a system, in a fourth embodiment, according to the present invention.

FIG. 15(a) shows a hardware environment for carrying out the present invention. Net data is entered by means of a keyboard 42, a light pen 43 and a tablet 44. A knowledge base and a data base are stored in a memory 46 and a magnetic disk file 45. The result of layout and interim result are provided by output units, namely, a display 47, a drafting machine 48 and a printer 49.

Figure 15B:
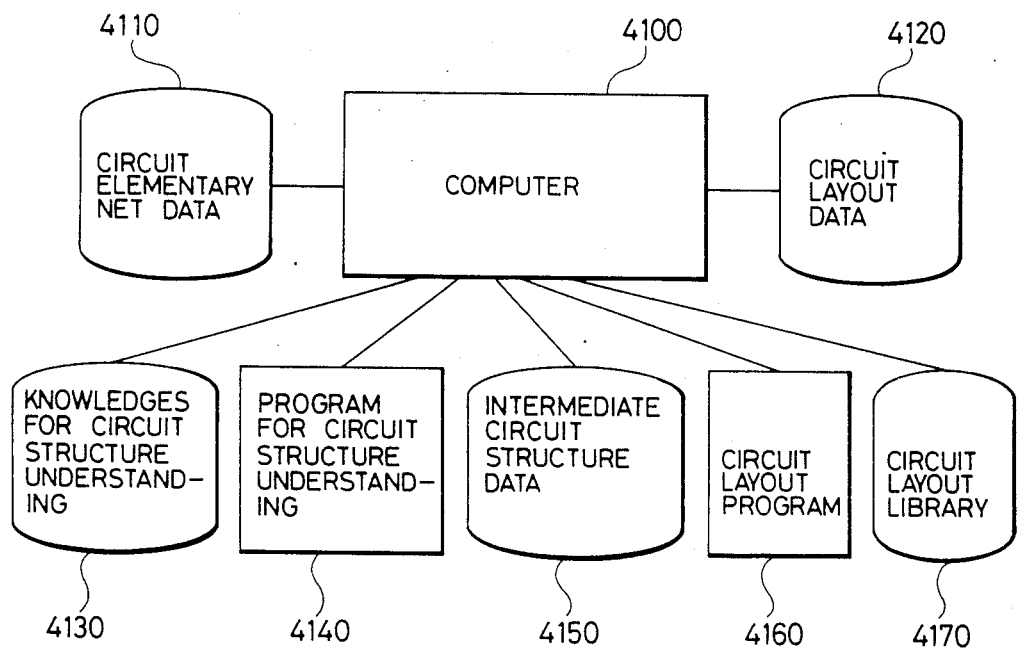

FIG. 15(b) shows a software constitution according to the present invention. In FIG. 15(b), indicated at 4100 is a computer. In this embodiment, i.e., the layout system, the input data is circuit elementary net data 4110, while the output data is circuit layout data 4120.

This system includes a circuit structure understanding function and a circuit layout function, which are realized by a program for circuit structure understanding 4140 and a circuit layout program respectively.

The program for circuit structure understanding 4140 understands and extracts a characteristic partial structure of a circuit included in the circuit elementary net data 4110 by using knowledges for circuit structure understanding 4130, and produces circuit intermediate structure data 4150.

The circuit layout program converts the circuit intermediate structure data 4150 into circuit layout data 4120 by using a circuit layout library 4170 storing the layout shape producing knowledge for the partial structure of the circuit.

Figure 16:
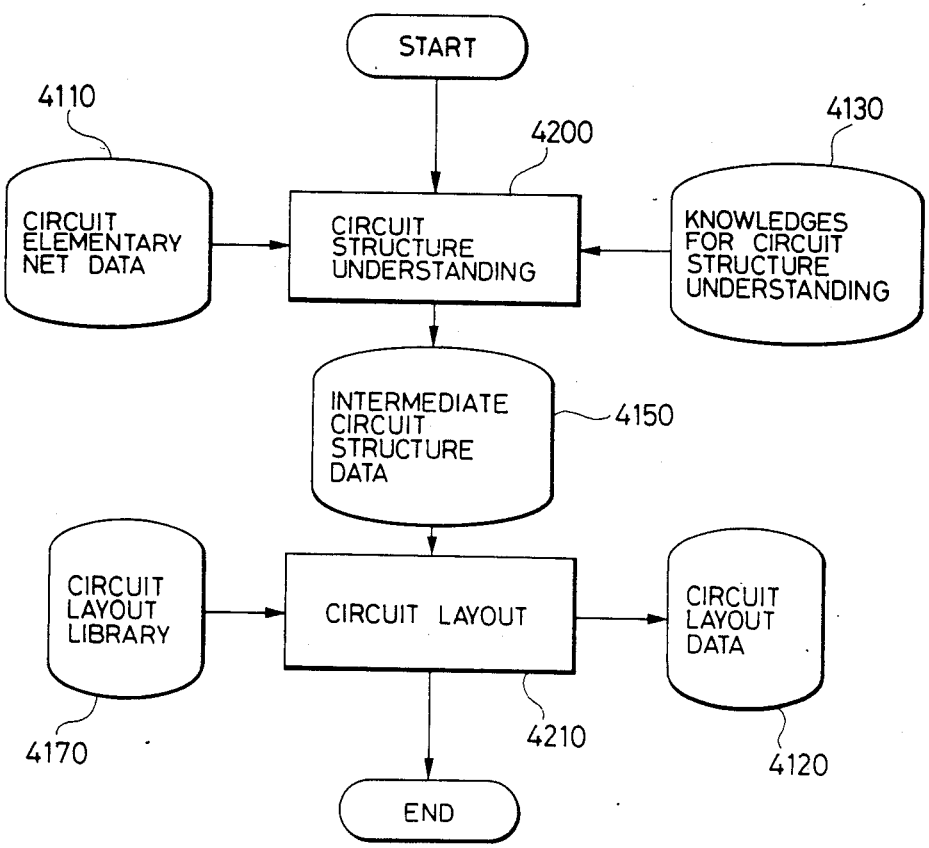
FIG. 16 is a flow chart showing the processes of the fourth embodiment of the present invention.

FIG. 16 shows the steps of processes of this system.

As mentioned above, at the first step 4200, circuit structure understanding is executed. At this step, the circuit net data 4110 into the circuit intermediate structure data 4150 by using the knowledges for circuit structure understanding 4130.

At the next step 4210, circuit layout is executed. At this step, the circuit intermediate structure data 4150 is converted into the circuit layout data 4120 by using the circuit layout library 4170.

Figure 17:
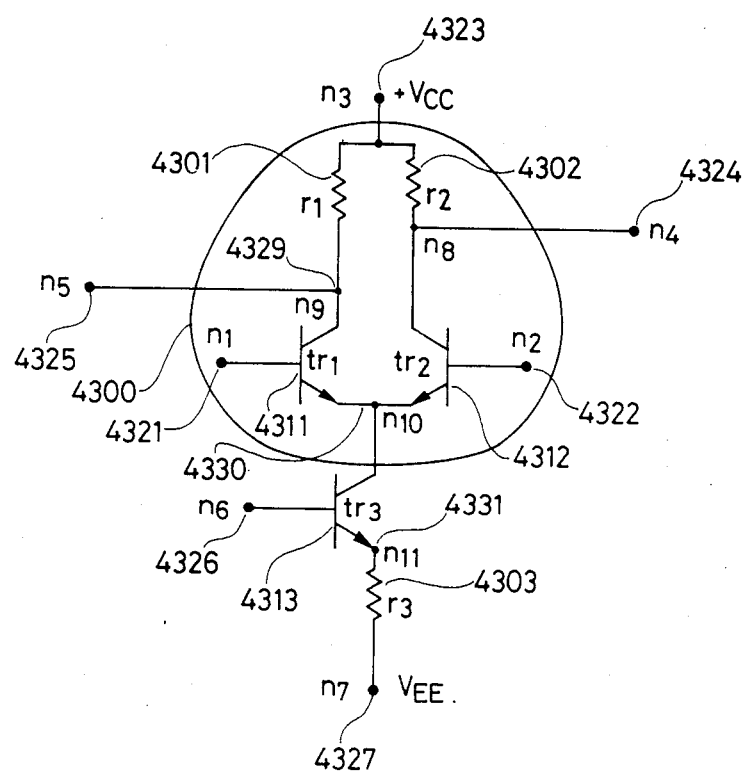
FIG. 17 is a circuit diagram of an exemplary electronic circuit taken by the embodiment in relation to the prior art.

FIG. 17 shows a circuit with which this embodiment deals. In FIG. 17, indicated at 4300 is a differential amplifier, at 4301, 4302 and 4303 are resistances, at 4311, 4312 and 4313 are npn transistors and 4321, 4322 and 4323 are nodes.

When a person considers the layout of the circuit, the person understands that a configuration 4300 of FIG. 17 is a differential amplifier and places the two pair transistors 4311 and 4312 adjacently and symmetrically. Generally, it is very difficult to enable a computer to develop such a high-degree layout only from circuit elementary net data. Nevertheless, it is an object of the present invention to achieve such a difficult subject.

In the following description of the embodiment, the artificial intelligence language prologue is employed. Refer to, for example, "Clocksin & Mellish; Programming in Prologue, Springer-Verlag, 1981" for this language.

In Program List 1, the circuit elementary net data 4110 of FIG. 15 is described in the prologue language and the circuit elementary net data corresponds to the circuit shown in FIG. 17, except the step 460.

In Program List 1, step 400 indicates that a transistor $tr_1$ are connected to nodes $n_1$, $n_9$ and $n_{10}$ respectively, and the allowable current is 1.

Step 410 indicates that a resistance r1 has nodes n3 and n9, and the value of resistance is 10. Step 420 indicates that nodes n8 and n4 are interconnected. Step 430 indicates that the node n1 is an input terminal, while step 450 indicates that the nodes n3 is a Vcc terminal.

Step 460 is not included in the circuit elementary net data, and is the result of circuit structure understanding by using the circuit elementary net data. The program including step 460 corresponds to the circuit intermediate structure data 4150 of FIG. 16. Step 460 indicates that a differential amplifier designated as Comp 1 is included, two npn transistors $tr_1$ and $tr_2$ are included, maximum current is 1, resistances $r_1$ and $r_2$ are included, and the respective values of resistance of the resistances $r_1$ and $r_2$ are 10 and 20.

[Program List 1]

```
/* circuit date */
tr(tr1,npn,n1,n9,n10,1).                           400
```

-continued

[Program List 1]

```
tr(tr2,npn,n2,n8,n10,1).
tr(tr3,npn,n6,n10,n11,2).
register(r1,n3,n9,10).                                    410
register(r2,n3,n8,20).
register(r3,n11,n7,10).
connect(n8,n4).                                           420
connect(n9,n5).
input(n1).                                                430
input(n2).
input(n6).
output(n4).                                               440
output(n6).
vcc(n3).                                                  450
vee(n7).                                                  450
comparator(comp1,tr1,tr2,npn,1,r1,10,r2,20)               460
```

Program List 2 indicates the exemplary contents of the knowledge for circuit structure understanding 4130 of FIG. 15. In this program list, step 500 and the following steps represent knowledge for understanding the differential amplifier. Steps 510 and 520 indicate that two transistors need to be included. Steps 530 and 540 indicate that two transistors need to be different from each other and the respective emitters of the transistors need to be connected to a common node. Steps 550 and 560 indicate that two resistances need to be included. Step 570 indicates that the two resistances need to be connected to the collectors of the transistors. Step 580 indicates an instruction to query an external unit for the designation of the differential amplifier which has been understood.

[Program List 2]

```
/* knowledge for understanding */
comparator__und(COMPNAME,TR1,TR2,
 TYPE,AMP,R1,REG1,R2,REG2):-                              500
 tr(TR1,TYPE,BASE1,COL1,EM1,AMP),                         510
 tr(TR2,TYPE,BASE2,EM2,AMP),                              520

TR1\==TR2,                                               530
 EM1=EM2,                                                 540
 register(R1,N11,N12,REG1,                                550
 register(R2,N21,N22,REG2),                               560
 (N11=N21,COL1=N12,COL2=N22;                              570
 N11=N22,COL1=N12,COL2=N21;
 N12=N21,COL1=N11,COL2=N22;
 N12=N22,COL1=N11,COL2=N21;)
 !,
 n1,
 write('input comp name: '),n1,                           
                                                          580
 read(COMPNAME).
```

Program List 3 corresponds to the program for circuit structure understanding 4140 of FIG. 15. Step 600 is the head of the program for circuit structure understanding. Step 610 is a step for setting an object of structure understanding. When the contents of information are those as described in step 660, the first variable X is a comparator and first the structure understanding of a differential amplifier is executed. Step 620 indicates the production of data structure Z for circuit structure understanding. The substance of step 620 is shown at step 650. Step 630 indicates circuit structure understanding from the elementary net data of the program list by using the data structure Z produced at step 620 and the contents of the knowledge base for structure understanding of Program List 2. Step 640 indicates the addition of the understood structure to the data of Program List 1. Step 460 shows the results of step 640.

Step 670 indicates an external instruction provided for calling the program of step 600. Step 680 indicates an output provided when step 580 of Program List 2 is executed during the execution of step 630. Step 690 indicates an externally given designation of the differential amplifier after structure understanding. Step 695 is an output provided as a result of understanding at step 640. This result indicates that the existence of a differential amplifier in the elementary net data of Program List 1 has been understood.

[Program List 3]

```
/* Program for understanding */
understand:-                                              600
understand(X,Y),                                          610
name(X,L1),
append(L1,"__und"',L2),
name(XX,L2),
generate__understand__goal(XX,Y,Z),                       620
call(Z),                                                  630
Z=..[XX|L], |
Z1=..[X|L], |
assert(Z1),                                               640
write('Cognition:'),write(Z1),n1,
fail.
understand.
append([],L,L):-!.
append([X|Y],L,[X|YY]):-append(Y,L,YY).
generate__understand__goal(X,Y,Z):-                       650
Z=..[X|Y],!.
understand(comparator,[_,_,_,_,_,_,_,_,_]).       ⎫
                                                  ⎬      660
understand(currentmirror,[_,_,_,_,_,_]).          ⎭
| ?-understand.                                           670
input comp name:                                          680
| :comp1.                                                 690
Cognition:comparator
(comp1,tr1,tr2,mpn,1,r1,10,r2,20)                         695
```

Figure 18:
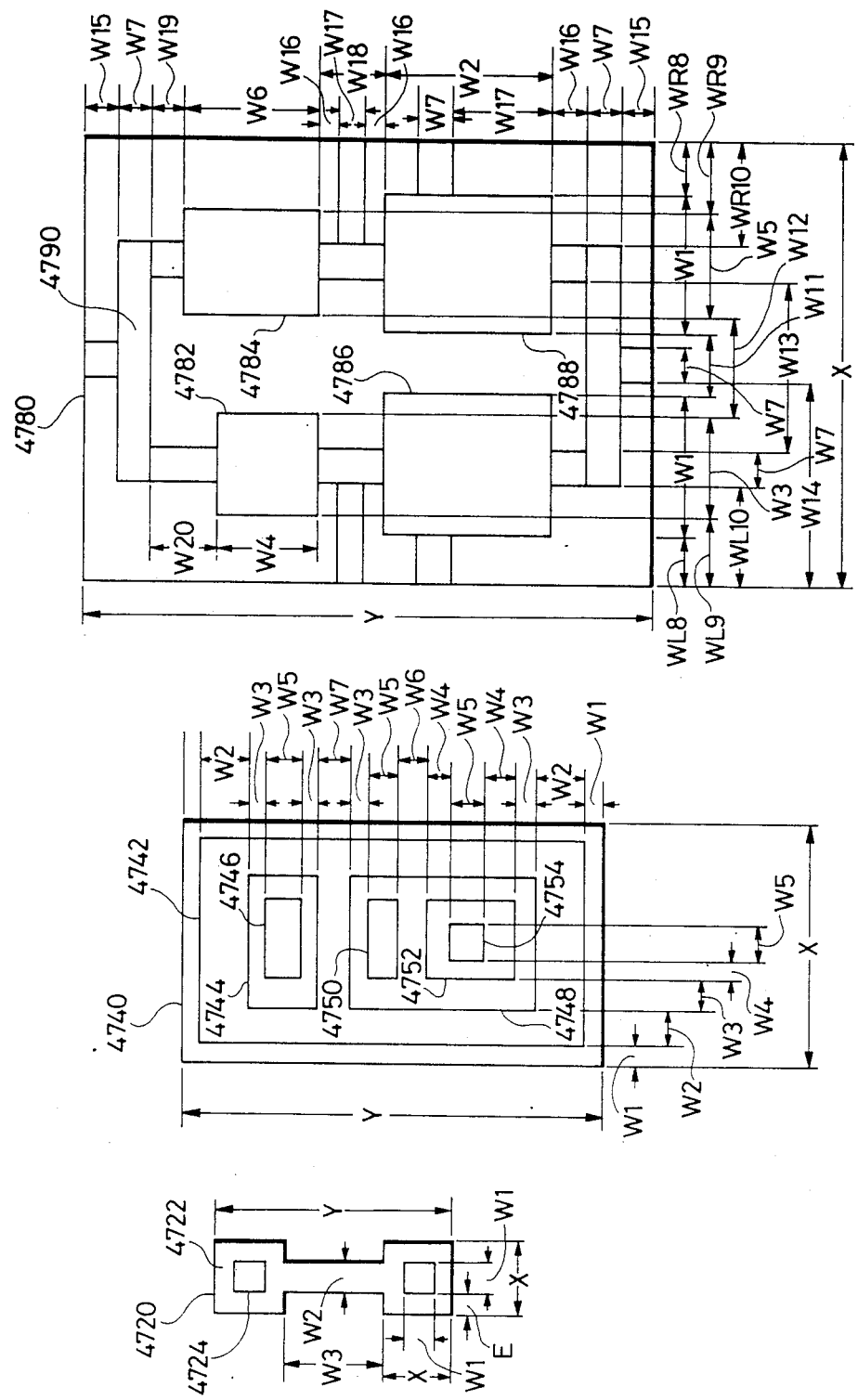
FIG. 18 is a circuit layout showing the layout shape of the parts of a circuit.

FIG. 18 shows a layout shape of a circuit components for assistance in explaining the layout function of this embodiment.

In FIG. 18, there are shown a resistance 4720 to be formed in the diffusion layer formed over a wafer, a resistance shape 4722 over the diffusion layer and a contact hole 4724 extending between the diffusion layer and the outside. The resistance shape is defined by X, Y, W1, W2, W2, W3 and E shown in FIG. 18.

There are also shown a layout shape 4740 of npn transistors, an isolation region 4742, a collector region 4744, a collector contact hole 4746, a base diffusion region 4748, a base contact hole 4750, an emitter region 4752, and an emitter contact hole 4754. The shape of the npn transistor is defined by X, Y, and W1 to W7.

Indicated at 4780 is a layout shape of the differential amplifier. Indicated at 4782 and 4784 are the external shapes of resistances and indicated at 4786 and 4788 are the external shapes of two pair transistors. Indicated at 4790 is an aluminum wiring. The layout shape of the differential amplifier is defined by X, Y and W1 to W20 as shown in FIG. 18. As well-known, these layout shapes are dependent on the electrical characteristics of the resistances, transistors and differential amplifiers respectively.

Program List 4 shows the concrete contents of the circuit layout library 4170 of FIG. 15.

Step 800 indicates a program for resistance layout to give the shape of the resistance 4720 of FIG. 18 to ANS. Step 810 is a program to read the resistance value OHM of the relevant resistance from the program list data and step 820 is a program to give the resistance shape of the given resistance value OHM to ANS. Step 830 is the realization of step 820. Step 840 is a program to read the size W1 of the contact hole of the resistance, in which the data given in step 850 decides W1 to be 5. Step 860 indicates that the width of the diffusion layer of the resistance is 10. Step indicates that the resistance value per unit length of the resistance of 10 width is 2.

| [Program List 4] (1) | |
|---|---|
| /* Layout knowledge */ | |
| /* register layout */ | |
| register_layout(ANS,REGNAME):- | 800 |
| register(REGNAME,_,_,OHM), | 810 |
| reg_layout(ANS,OHM). | 820 |
| reg_layout([X,Y,W1,W2,W3],OHM):- | 830 |
| width(contact,hall,W1), | 840 |
| width(reg ,_, W2), | |
| width(contact,edge,E), | |
| reg_coef(W2,R), | |
| W3 is OHM/R, | |
| X is 2*E+W1, | |
| Y is 2*X+W3, | |
| width(contact,hall,5). | 850 |
| width(reg,diff, 10). | 860 |
| width(contact,edge,3). | |
| reg_coef(10,2). | 870 |

| [Program List 4] (2) | |
|---|---|
| /* transister layout */ | |
| transister_layout(ANS,TRNAME):- | 880 |
| tr(TRNAME,TYPE,_,_,_,AMP), | |
| tr_layout(ANS,AMP,TYPE). | |
| tr_layout([X,Y,W1,W2,W3,W4,W5,W6,W7],AMP,npn):- | |
| width(iso,AMP,W1), | |
| width(well,AMP,W2), | |
| width(c_contact_edge,AMP,W3), | |
| width(contacedge,AMP,W4), | |
| width(emcontact,AMP,W5), | |
| width(base_emmitta,AMP,W6), | |
| width(cont_basediff,AMP,W7), | |
| X is 2*(W1+W2+W3+W4)+W5, | |
| Y is W1+W2+W3+W4+W5+W6+W5+W3+W7+ W3+W5+W3+W2+W1. | |
| width(iso,AMP,10):-0=<AMP,AMP=<10,!. | 890 |
| width(iso,AMP,20). | |
| width(well,AMP,20):-0=<AMP,AMP=<20,!. | |
| width(well,AMP,30). | |
| width(c_contact_edge,AMP,5):-0= <AMP,AMP=<10,!. | |
| width(c_contact_edge,AMP,10). | |
| width(contactedge,AMP,5):-0= <AMP,AMP=<10,!. | |
| width(contactedge,AMP,10). | |
| width(emcontact,AMP,10):-0= <AMP,AMP=<10,!. | |
| width(emcontact,AMP,15). | |
| width(base_emmitta,AMP,10):-0= <AMP,AMP=<10,!. | |
| width(base_emmitta,AMP,15). | |
| width(cont_basediff,AMP,15):-0= <AMP,AMP=<10,!. | |
| width(cont_basediff,AMP,20). | |

| [Program List 4](3) | |
|---|---|
| /* comparator layout */ | |
| comparator_layout(ANS,COMPNAME):- | 892 |
| comparator(COMPNAME,TR1,TR2,TYPE,AMP, R1,REG1,R2,REG2), | |
| comp_layout(ANS,TR1,TR2,TYPE,AMP, R1,REG1,R2,REG2). | |
| comp_layout([X,Y,W1,W2,W3,W4,W5,W6,W7,WL8,WL9, WL10,WR8,WR9,WR10,W11,W12,W13, W14,W15,W16,W17,W18,W19,W20], TR1,RT2,npn,AMP,R1,REG1,R2,REG2):- | |

[Program List 4](3) -continued tr_layout([([TX,TY,TW1,TW2,TW3,TW4,TW5, TW6,TW7],AMP,npn),
W1 is TX,
W2 is TY,
reg_layout([RX1,RX2,RW1,RW2,RW3],REG2),
reg_layout([RRX1,RRX2,RRW1,RRW2,RRW3,],REG2),
W3 is RX1,
W4 is RX2,
W5 is RRX1,
W6 is RRX2,
width(all,line,W7),
width(comparator,inter_tr,WW11),
width(comparator,inter_reg,WW12),
XLENGTH1 is W1+EE11,
XLENGTH2 is (W3+W5)/2+EE12,
width(comparator,sidemargine,WS),
max(XLENGTH1,XLENGTH2,XX),
W11 is XX−W1,
W12 is XX−(W3+W5)/.2,
XLENGTH3 is W1/2+WS,
XLENGTH4 is W3/2+WS,
XLENGTH5 is W5/2+WS,
max(XLENGTH3,XLENGTH4,XXX),
WL8 is XXX−W1/2,
WL9 is XXX−W3/2,
max(XLENGTH3,XLENGTH5,XXXX),
WR8 is XXXX−W1/2,
WR9 is XXXX−W5/2,
WL10 is XXX+W7/2,
WR10 is XXXX+W7/2,
W13 is XX+W7,
X is XX+W1+WL8+WR8,
W14 is (X−W7)/2,
W15 is WS,
width(comparator,gap,W16),
YLENGTH1 is W6+W16,
YLENGTH2 is W4+W16,
max(YLENGTH1,YLENGTH2,YY),
W17 is TW1+TW2+TW3+TW4+TW5+TW4+TW6+ (TW5−W7)/2,
W18 is 2*W16+W7
W19 is YY−W6,
W20 is YY−W4,
Y is W15+W7+W16+W2+W18+YY+W7+W15.
max(A,B,C):−A<B,!,C is B.
max(C,_,C).
width(all,line,2),
width(comparator,inter_tr,8).
width(comparator,inter_reg,6).
width(comparator,sidemargine,5).
width(comparator,gap,2).

Step 880 is a program to layout a transistor of a name, TRNAME, and to return the result to ANS, and its oonstitution is quite similar to that for the resistance. Step 890 and the following steps indicate that the shape of the transistor is dependent on maximum current.

Step 890 indicates that the width of the isolation region 4724 of the layout shape 4740 shown in FIG. 18 is 10 when the maximum current is 10 or below and the same is 20 when the maximum current is over 10.

Step 892 is a program for laying out the differential amplifier. The constitution of this program is similar to that for the resistance.

Program List 5 provides the circuit layout program 4160 of FIG. 15.

Step 900 is the head of the layout program. Step 902 is a program for the initial data setting process to produce a layout region. Step 904 is a program of a process for setting factors to be laid out. First a differential amplifier is laid out from the data given in step 924. Step 906 defines the data or the structure of the object to be laid out. Step 926 shows the realization of step 906. Step 908 indicates the execution of the layout.

```
[Program List 5](1)
/* layout program */
layout:-                                              900
assert(current_place(0)),                             902
layout(X,Y),                                          904
generate_layout_us,5 goal(X,Y,Z),                     906
call(Z),                                              908
place(I,J),                                           910
rotation(R),                                          912
Z=..[NAME|LIST],
LIST=[[DX,DY|_]|_],
L=[I,J,R|LIST],
ZZ=..[NAME|L],
zone(DX,DY,R,ZX,ZY),                                  914
I1 is I+ZX,
J1 is J+ZY,
good(I,J,I1,J1)n1,                                    916
write(good),n1,
assert(ZZ),                                           918
assert(occupied(I,J,I1,1,NAME)),                      920
write('layout plan:'),n1,
                                                  }   922
write(ZZ).
layout(comparator_layout,[_,_]).
                                                  }   924
layout(currentmirror_layout,[_,_]).
generate_layout_goal(X,Y,Z):-                         926
Z=..[X|Y],!.
planesize(500,500).                                   928
place(X,Y):-                                          930
retract(current_place(XX)),
XXX is XX+1,
assert(current_place(XXX)),
planesize(A,B),
C is XX/A,
Y is C+1,
X is XX-C*A,
C=<B.
rotation(0).
rotation(90).                                     }
rotation(180).                                        932
rotation(270).
[Program List 5](2)
zone(DX,DY,R,ZX,ZY):-                                 934
(R=0,ZX is DX,ZY is DY;
R=90,ZX is -DX,ZY is DX;
R=180,ZX is -DX,ZY is -DY;
R=270,ZX is DY,ZY is -DX),!.
good(I1,J1,I2,J2):-                                   936
occupied(II1,JJ1,II2,JJ2,NAME),                       937
order(II1,JJ1,II2,JJ2,III1,JJJ1,III2,JJJ2),
order(I1,J1,I2,J2,I11,J11,I21,J21),
(in(III1,JJJ1,III2,JJJ2,I11,J11,I21,J21);
in(I11,J11,I21,J21,III1,JJJ1,III2,
JJJ2)),!,fail.
good(_,_,_,_).
occupied(0,0,100,200,box1).                           938
in(III1,JJJ1,III2,JJJ2,I11,J11,I21,J21):-             940
(III1>=I11,III1=<I21,JJJ1>=J11,JJJ1=<J21;
III1>=I11,III1=<I21,JJJ2>=J11,JJJ2=<J21;
III2>=I11,III2=<I21,JJJ1>=J11,JJJ1=<J21;
III2>=I11,III2=<I21,JJJ2>J11,JJJ2=<J21),!.
order(A,B,C,D,K,L,M,N):-
((A<C,B<D,K is A,L is B,M is C,N is D);
(C<A,B<D,K is C,L is B,M is A,N is D);
(A<C,D<B,K is A,L is D,M is C,N is B);
(C<A,D<B,K is C,L is D,M is A,N is B)),!.
|?-layout.                                            942
layout plan:                                          944
comparator_layout(101,1,0,[198,196,90,140,
11,27,11,32,2,5,45,51,5,
                                                      946
45,51,8,87,100,98,5,2,69,
6,2,7],compl)
```

Step 910 is a program for assuming the position of a laid-out object on a two-dimensional plane, and coordinates (I, J) is a candidate place. Step 930 is a concrete program for producing a candidate place. Step 912 is a program for assuming the direction of the object laid-out at the candidate place. As shown in step 932, the direction may be selected among four directions, 0°, 90°, 180° and 270°.

Step 914 is a program for determining a vector (ZX, ZY) obtained by turning an optional two-dimensional vector (DX, DY) through an angle R. Step 934 shows the realization of step 914.

Step 916 is a program for making decision as to whether or not a rectangle of I1 lateral length and J1 longitudinal length can be placed at the candidate place (I, J). Step 936 shows the reality of step 916. As shown at step 938, a decision as to whether or not any object has already been laid out is made at step 937.

Step 918 is a program for storing the layout shape of the object to be laid out stored in ZZ. Step 920 is a program for storing a region in which further layout of any object is impossible due to the layout of the object stored in ZZ. Step 922 is a program for giving the contents of ZZ to an external unit and displaying the same.

Step 928 indicates a region for laying out an object; the region is a plane of 500 lateral size and 500 longitudinal size.

Step 940 shows a function for checking whether or not any objects overlap.

Step 942 is an external input to operate the layout program 900, and the resultant output is given to an external unit at step 922. Steps 944 and 946 indicate the outputs of step 922. The contents of the circuit layout data 4120 of FIG. 15 are the same as the contents of steps 928, 938 and 946, and hence the description of the contents of the circuit layout data 4120 will be omitted.

Step 946 indicates that a differential amplifier, compl, is laid at a position (101, 1) at an angle of 0°.

Figure 19:
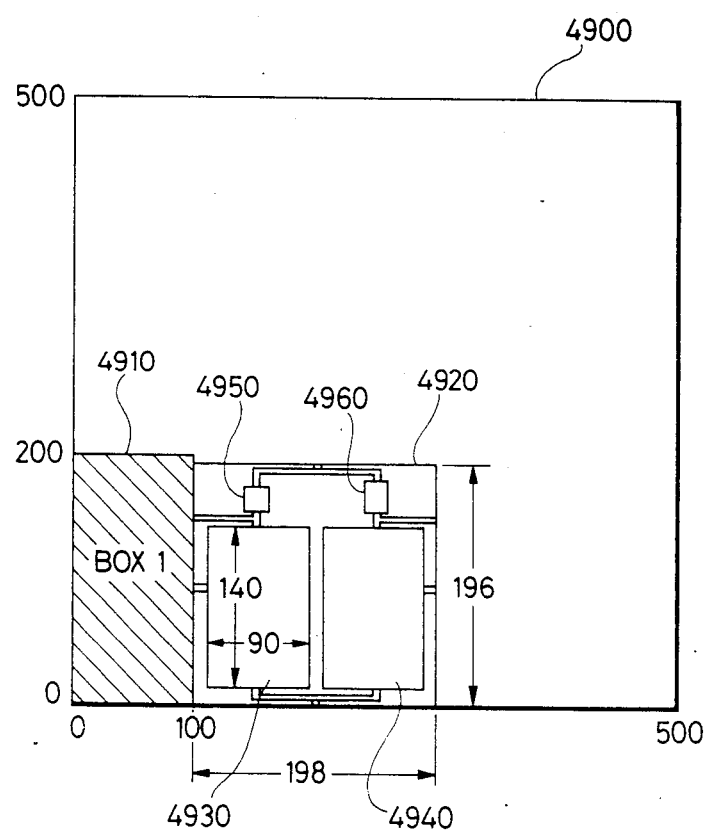
FIG. 19 is an explanatory illustration showing a mode of layout according to the present invention.

FIG. 19 shows a layout region 928, laid-out objects 938 and differential amplifier layout 946.

As apparent from FIG. 19, a differential amplifier 4920 is placed by avoiding an obstacle, i.e., box1 4910 on a plane 4900 of (500, 500). In the differential amplifier 4920, pair transistors 4930 and 4940 and resistances 4950 and 4960 are laid out in conformity with the restrictive rule of layout for the differential amplifier that the pair transistors need to be disposed adjacently and symmetrically.

It is apparent from what has been described hereinbefore that the differential amplifier of the electronic circuit shown in FIG. 17 can correctly be laid out as shown in FIG. 19 through the procedures of FIG. 16 by the layout system of the functional constitution of FIG. 15.

The circuit data used for this layout was those excluding step 460 among steps 400 to 460 of Program List 1. That is, only the circuit elementary data was used. Nevertheless, the existence of the differential amplifier was understood by employing the knowledge for circuit structure understanding, and the correct layout of the differential amplifier was decided by using the knowledge of differential amplifier layout on the basis of the result of understanding.

Although the present invention has been described hereinbefore with reference to the embodiments thereof as realized by software, the algorithm of the present invention may be realized by means of hardware, namely, may partially be realized by means of a microcomputer or may be realized by a special purpose hardware.

The present invention is capable of realizing a high-degree intelligent layout system capable, for example, of understanding the existence of a differential amplifier in a circuit and achieving correct layout of the components according to the result of understanding only from the given elementary net data of the circuit. Such functions have not been realized by the conventional layout CAD system and have been possible only by a person. Thus the present invention is capable of providing an automatic layout CAD system.

The fifth embodiment of this invention will be described using FIG. 20 which illustrates the layout object conceptually. Reference number (5100) denotes a layout object (block) with a name of 'do' and an expected area of 750. The block 'do' includes three sub blocks do1 (5110), do2 (5120) and do3 (5130) with nets existing between the sub blocks. There is a net of five units between the do1 and do2, and there is a net of three units between the do2 and do3.

Block do1 (5140) has an individual hierarchical structure with an estimated area of 450 for example, and includes a block do11 (5142) and other blocks with nets existing between the blocks.

Block do11 (5150) has an estimated area of 150, and includes blocks do5111, do5112 and do5113.

Block do5111 (5160) is made up of element blocks b15 (5162), B16 (5164) and so on, and the block B15 (5170) is an elemental circuit with a fixed size of 4 by 6 as shown in the figure.

Figure 20:
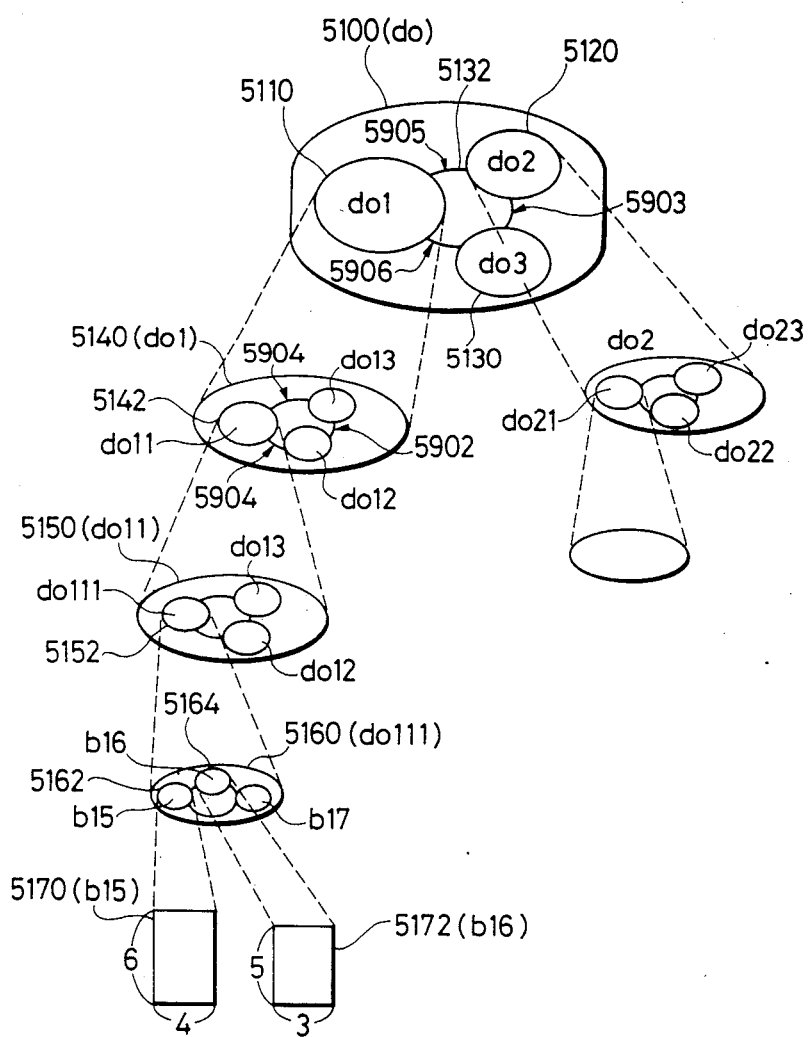
FIG. 20 is a conceptional illustration for the explanation of the hierarchical structure of an objective electronic circuit of a fifth embodiment of the present invention.

The following describes the method of layout for the circuit which is described in a hierarchical structure as shown in FIG. 20. For clafifying the explanation, only the layout function of this embodiment will be described and the wiring function will be omitted.

Figure 21A:
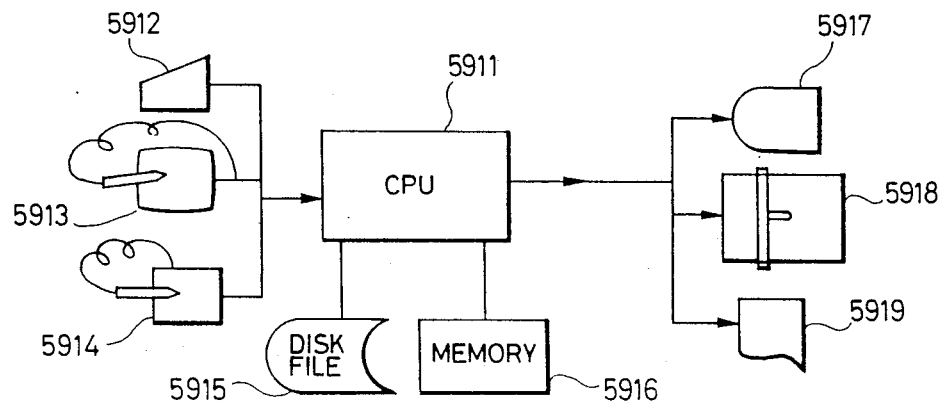
FIG. 21(a) is a block diagram of the hardware environment of an embodiment of the present invention.

FIG. 21(a) shows the hardware environment for carrying out this invention. Net data is entered through the keyboard 5912, light pen 5913 and tablet 5912. The knowledge base and data base are realized by the memory unit 5916 and magnetic disk file unit 5915. The layout result and intermediate result are outputted on the display unit 5917, plotter 5918 and printer 5919.

FIG. 21 shows the software organization of this invention. The computer system 5200 is connected with the data file 5120 for the hierarchical system shown in FIG. 20, the hierarchical layout program file 5220, pattern library file 5230 and output data file to which the layout result is delivered.

Figure 22:
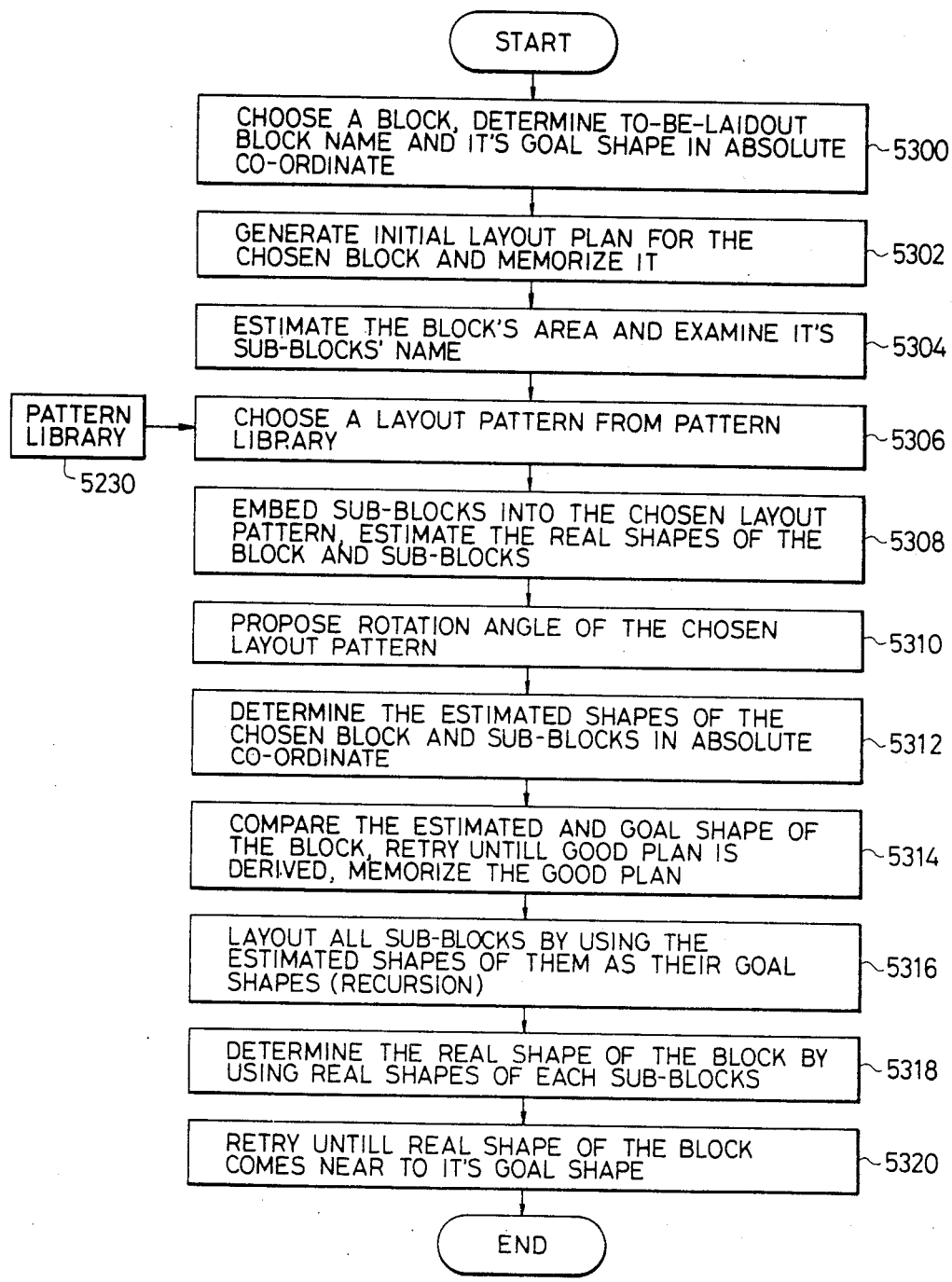
FIG. 22 is a flow chart showing the steps of processes of the system according to the present invention.

FIG. 22 shows the layout process in a flowchart.

Initially, a layout block name (usually the highest-level block name, such as 'do' in FIG. 20) and a layout target shape of the block measured on the absolute coordinates are given (step 5300). Next, the estimated area, sub block name and other information about the block are examined (step 5304). Next, the initial layout candidate of the block is memorized (step 5302) so that it is used in selecting a satisfactory layout candidate in the later process. Next, one of the pattern libraries is selected (step 5306). Next, an assignment policy for sub blocks is assumed for the selected pattern, and the presumed shape of the block is calculated (step 5308). Next, the rotational angle of the selected pattern is assumed (step 5310). Next, the presumed shape of the block after pattern rotation measured on the absolute coordinate system is calculated (step 5312). Next, the presumed shape of the block is processed until it matches the target shape on a try-and-error basis, and the result is memorized (step 5314). Next, all sub blocks of the block are laid out individually as shown in step 5316 (this step is carried out recursively, namely, the whole processing facility of FIG. 22 is utilized repeatedly to implement the layout). Next, the shape of the block is calculated basing on the resultant shape of layout of each sub block (step 5318). Next, the actual shape obtained by the above process is compared with the target shape as shown in step 5320, and layout of this block is carried out on a try-and-error basis until the actual shape reaches the target.

Figure 21B:
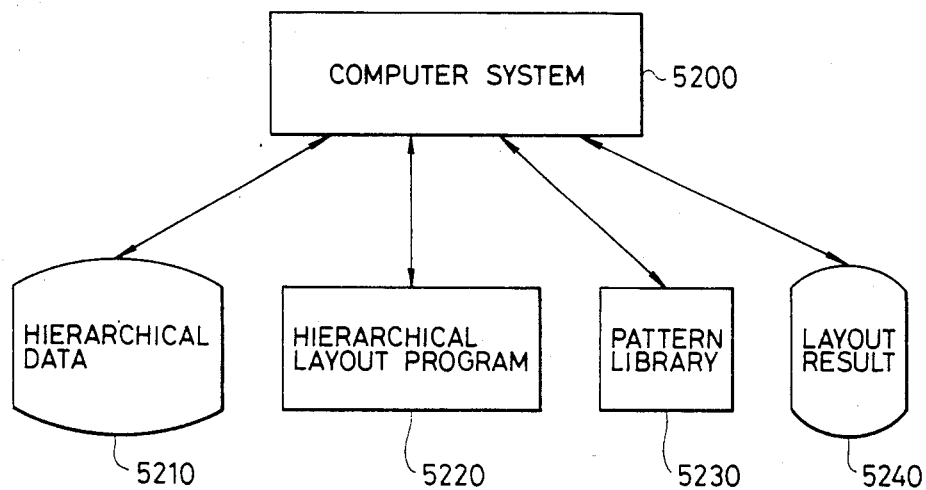
FIG. 21(b) is an illustration showing the functional structure of a software of the system according to the present invention.

The program list (1) is the description of the system shown in FIG. 20, and it is included in the hierarchical data 5210 of FIG. 21(b). This embodiment employs the Prolog language which is well known as an artificial intelligence language.

In the program list, line 400 indicates that the block 'do' consists of sub blocks do1, do2 and do3, and has an estimated area of 750. Line 410 indicates that the sub block do1 consists of sub blocks do11, do12 and do13, and has an estimated area of 450. Lines 420 and 430 are similar data for the sub blocks do11 and do111. Line 440 is data for the lowest-level block b15, indicating the area of 24 and actual shape of 4 by 6. Lines 450 and 460 are similar data indicating the shapes of B16 and B17.

| Program list (1) | |
|---|---|
| /* data of layout */ | |
| b(d0,[d01,d02,d03],750,__,__). | 400 |
| b(d01,[d011,d012,d013],450,__,__). | 410 |
| b(d011,[d0111,d0112,d0113,]__,__). | 420 |
| b(d0111,[b15,b16,b17,],59,__,__). | 430 |
| b(b15,[ ],24,[4,6],__). | 440 |
| b(b16,[ ],15,[3,5],__). | 450 |
| b(b17,[ ],15,[3,5],__). | 460 |
| b(d0112,[b18,b19],42,__,__). | |
| b(b18,[ ],24,[4,6],__). | |
| b(b19,[ ],18,[3,6],__). | |
| b(d0113,[20,b21,b22],54,__,__). | |
| b(b20,[ ],18,[3,6],__). | |
| b(b21,[ ],18,[3,6],__). | |
| b(b22,[ ],18,[3,6],__). | |
| b(d012,[d0121,d0122],168,__,__). | |
| b(d0121,[d01211,d01212],98,__,__). | |
| b(d01211,[b4,b5],56,__,__). | |
| b(b4,[ ],24,[3,8],__). | |
| b(b5,[ ],32,[4,8],__). | |
| b(d02,[d021,d022,d023],120,__,__). | |
| b(d021,[b23,b24,b25],40,__,__). | |
| b(b23,[ ],12,[3,4],__). | |
| b(b24,[ ],16,[4,4],__). | |
| b(b25,[ ],12,[3,4],__). | |
| b(d022,[b26,b27,b28],32,__,__). | |
| b(b26,[ ],12,[3,4],__). | |
| b(b27,[ ],8,[2,4],__). | |
| b(b28,[ ],12,[3,4],__). | |
| b(d023,[d0231,b32,b33],48,__,__). | |
| b(d0231,[b,29,b30,b31],24,__,__). | |
| b(b29,[ ],8,[2,4],__). | |
| b(b30,[ ],8,[2,4],__). | |
| b(b31,[ ],8,[2,4],__). | |
| b(b32,[ ],12,[3,4],__). | |

The program list (2) contain wiring data between blocks of the circuit shown in FIG. 20. Line 500 indicates that three wires exist between blocks do21 and do23, while line 510 indicates that three wires exist between do22 and do23.

| Program list (2) | |
|---|---|
| c(d021,d023,3). | 500 |
| c(d022,d023,3). | 510 |
| c(b26,b27,2). | |
| c(b27,b28,2). | |
| c(d0231,b32,2). | |
| c(d0231,b33,2). | |
| c(b32,b33,1). | |
| c(b29,b30,1). | |
| c(b30,b31,1). | |

-continued

| Program list (2) |
| --- |
| c(d031,d032,1). |
| c(d031,d033,4). |
| c(d032,d033,2). |
| c(b41,b42,2). |
| c(b42,b43,1). |
| c(d0321,b332,1). |
| c(b46,b47,1). |
| c(d0332,d0333,3). |
| c(b34,b35,2). |
| c(b36,b37,1). |
| c(b37,b38,2). |
| c(b39,b40,1). |

Program list (3) is the hierarchical layout program 5220 shown in FIG. 21(b). Line 600 is the head of a program named "layout" (a section on the left of symbol ":-" is called head, while a section on the right of the symbol is called body). This program has a name "layout", and the first variable BLOCK represents the object block to be laid out, the second variable FLOOR indicates the name of pattern when the block specified by BLOCK is laid out, the third variable ROTATION indicates the layout angle of pattern, the fourth variable [GX,GY] represents the target layout shape of the block, and the fifth variable [RX,RY] represents the real layout shape.

Line 610 corresponds to step 5302 of FIG. 22, memorizing initially an inferior layout candidate having a too long wiring between layout objects and too large gap from the target layout shape. Line 620 corresponds to step 5304 of FIG. 22, extracting in FIG. 23 sub blocks and estimated area of the block specified by the variable BLOCK. Line 630 corresponds to steps 5306 through 5320 in FIG. 22, implementing layout using patterns and creating a real shape [RX,RY] which meets the target shape [GX,GY]. Line 640 displays the resultant layout by writing data in the file 5240 shown in FIG. 21(b). Line 650 is a particular program segment for implementing the step 5300 of FIG. 22, instructing the layout of the block 'do' basing on the target shape [25,30].

| Program list (3) | |
| --- | --- |
| /* program */ | |
| layout(BLOCK,FLOOR,ROTATION,[GX,GY], | 600 |
| [RX,RY]):-assert1(floorplan(_BLOCK,_,_,_,_), | |
| linelength(9999),shapegap_value(9999))), | 610 |
| b(BLOCK,SUBBLOCK,AREA,RDZM,_), | 620 |
| floor(FLOOR,BLOCK,ROTATION,SUBBLOCK, | 50 |
| [GX,GY],[RX,RY],GDZM,RDZM | 630 |
| write(floor(FLOOR,BLOCK,ROTATION,SUBBLOCK, | |
| [GX,GY],[RX,RY],GDZM,RDZM | 640 |
| ?-layout(do,FLOOR,ROTATION,[25,30],[RX,RY]). | 650 |

Steps 5306 through 5320 in FIG. 22 are the processings of assigning the circuit to the library patterns. Before explaining this process, the layout pattern will be described using FIG. 23.

Reference number 5700 denotes a layout pattern of a block having no sub block as shown by b15 on line 440 in the program list (1), and it is a rectangle with a lateral dimension of X and longitudinal dimension of Y, where X and Y are unknown values. 5710 is a pattern for laying out a block consisting of three sub blocks, where B1, B2 and B3 are variables for the name of blocks allocated in it and X11-X31 are variables representing the shape. 5720 is a pattern for layout out a block having two sub blocks, and 5730 is a pattern for laying out a block having three sub blocks, but is different from 5710.

Figure 23:
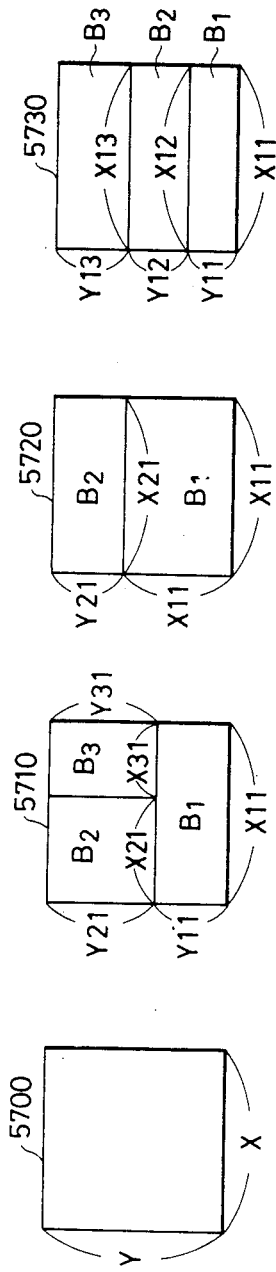
FIGS. 23 and 24 are conceptional illustrations of layout patterns according to the present invention.

In laying out a block, a proper pattern is selected from among those shown in FIG. 23, the circuit to be laid out is embeded in the pattern, the target value is determined in consideration of the estimated area of each sub block, e.g., variables X11, Y11 and so on for the pattern 5710, and each sub block is laid out basing on the target value (recursive process).

Figure 24:
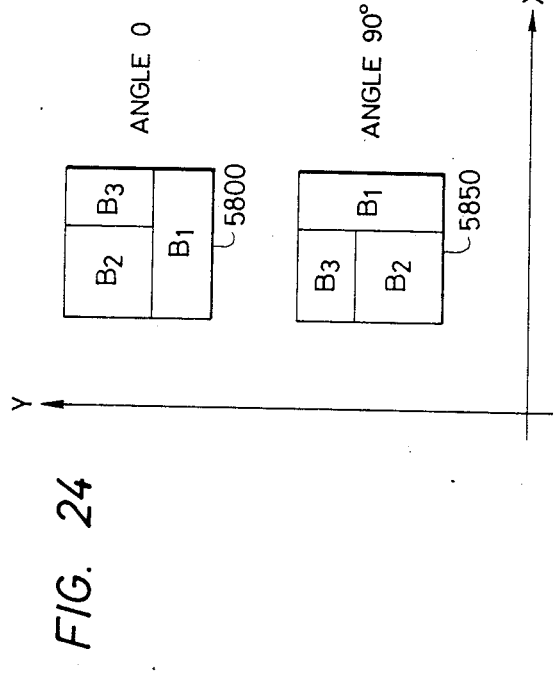

FIG. 24 shows the rotational angle of pattern on the absolute coordinates, in which pattern 5800 is derived from the pattern 5710 in FIG. 23 and laid out in 0°-angle, while pattern 5850 is laid out in 90°-angle. The angle itself is also an object f the layout plan.

Program lists (4) through (7) are examples of programs contained in the pattern library 5230 shown in FIG. 21(b), and are intended to layout the patterns 5700-5730 shown in FIG. 23.

In the program list (4), line 900 is the head of the program, which includes a pattern name "floor 0", variable BLOCK indicating the block to be laid out, variable ROTATION indicating the pattern rotational angle, sub block indicated by the blank space [ ], target shape [GX,GY] in the absolute coordinate system, layout real shape [RX11,RY11], and pattern real shape [RX11,RY11].

Line 910 calculates the rotational angle, and line 920 modifies the pattern real shape [RX11,RY11] according to the rotational angle so as to obtain the layout real shape [RX,RY] in the absolute coordinate system. Line 930 compares the real shape [RX,RY] with the target shape [GX,GY] and sets the difference to SHAPE-GAPVALUE. Line 940 verifies the block for the gap SGV between the real shape and target shape of the layout plan which has been created and stored. Line 950 compares the current shape with the planed one and updates the stores shape if improvement is recognized. Line 980 compares the real shape [RX,RY] with the target shape [GX,GY] to check the satisfaction of the result, and terminates the processing of program 900 if the result is sataisfactory, otherwise the process is cycled from the beginning. Lines 910–980 correspond to steps 5306–5320 in FIG. 22, but because of the simple pattern structure, some of processing in FIG. 22 is unnecessary and thus such portions may not exist in the program list (4).

| Program list 4 | |
| --- | --- |
| /* florplan — floor0 */ | |
| floor(floor0,BLOCK,ROTATION,[ ],[GX,GY], | |
| [RX,RY],[GX11,GY11],[RX11,RY11]) :- | 900 |
| rotation(ROTATION), | 910 |
| change(RX11,RY11,ROTATION,RX,RY | 920 |
| shape_gap_value | |
| (GX,GY,RX,RY,SHAPEGAPVALUE), | 930 |
| floorplan(_, BLOCK,_,_,_,_,_,_,_, | |
| shapegap_value(SGV) | 940 |
| SHAPEGAPVALU < SGV, | 950 |
| retract1(floorplan | |
| (_,BLOCK,_,_,_,_,_,_,_)), | 960 |
| assert1(floorplan(floor0,BLOCK,ROTATION, | |
| [],[GX,GY],[RX,RY],[GX11,GY11], | |
| [RX11,RY11],_,shapegap_value | |
| (SHAPEGAPVALU))), | 970 |
| shape_ok(GX,GY,RX,RY). | 980 |

The program list (5) corresponds to the pattern 5710 in FIG. 23. Line 1000 is the head of the program, and a program is selected by step 5306 of FIG. 22 through the matching operation with line 630 of program list (3).

Lines 1010 and 1020 corresponds to step 5308 of FIG. 22. Line 1030 tests whether all of the target shape variables are positive. Line 1040 calculates the approximate total wiring length between blocks resulting from sub-block assignment to a layout pattern in line 1010. Line 1050 provides the presumed rotational angle in correspondence to step 5310 of FIG. 22. Line 1052 corresponds to step 5312 of FIG. 22, and lines 1054 and 1056 correspond to step 5314. Lines 1058 through 1062 are the layout processings for the sub blocks B1, B2 and B3, and they are the recursive process corresponding to step 5316 of FIG. 22 to call programs in the program list (4). Line 1064 corresponds to step 5318 and line 1066 corresponds to step 1066 of FIG. 22.

```
Program list (5)
/* florplan --- floor1 */
floor(floor1,BLOCK,ROTATION,[B1,B2,
B3],[GX,GY], [RX,RY],[GX11,GY11,GX21,GY21,
GX31,GY31], [RX11,RY11,RX21,RY21, RX31,RY31]):-       1000
 b(B1,BLIST1,AREA1,]GBX1,GBY1],_),           ⎫
 b(B2,BLIST2,AREA2,[GBX2,GBY2],_),           ⎬ 1010
 b(B3,BLIST3,AREA3,[GBX3,GBY3],_),           ⎭
 GX11 is GX, GY11 is AREA1/GX11,             ⎫
 GX21 is AREA2/(GX-GY11), GY21 is GY-GY11,   ⎬ 1020
 GX31 is GX11-GX21, GY31 is AREA3/GX31,      ⎭
 GX11 > 0, GY11 > 0, GX21 > 0, GY21 > 0,
 GX31 > 0, GY31 > 0,                                   1030
 length1(B1,B2,B3,A1,A2,A3),                 ⎫
 AA1 is ((A1*GX31)/GX11)*((GX31+GY21)/2),    ⎪
 AA2 is ((A3*GX21)/GX11)*((GX21+GY31)/2),    ⎬ 1040
 AA3 is 0,                                   ⎪
 TOTALLENGH is AA1+AA2+AA3,                  ⎭
 max(GY21,GY31,GYY),
 GGYY is GY11+GYY,
 rotation(ROTATION),                                   1050
 change(GX11,GGYY,ROTATION,GGX11,GGGYY),               1052
 shape_gap_value
 (GX,GY,GGX11,GGGYY,SHAPEGAPVALUE),                    1054
 floorplan(_,BLOCK,_,_,_,_,_,_,_,              ⎫
 linelength(LX),shapegap_value(SGV)),        ⎪
 SHAPEGAPVALUE < SGV,                        ⎪
 TOTALLENGH < LX,                            ⎬
 retract1(floorplan                          ⎪
 (_,BLOCK,_,_,_,_,_,_,_,_)),                 ⎪ 1056
 assert1(floorplan(_,BLOCK,ROTATION,         ⎪
 [B1,B2,B3],[GX,GY],_,[GX11, GY11,GX21,GY21, ⎪
 GX31,GY31],_,linelength(TOTALLENGH),        ⎪
 shapegap_value(SHAPEGAPVALUE))),            ⎭
 change(GX11,GY11,ROTATION,GXB1,GYB1),       ⎫
 layout(B1,FLOORB1,ROTB1,[GXB1,GYB1],        ⎪
 [RXB1,RYB1]),                               ⎬ 1058
 shape_ok(GXB1,GYB1,RXB1,RYB1),              ⎪
 change(RX11,RY11,ROTATION,RXB1,RYB1),       ⎭
 change(GX21,GY21,ROTATION,GXB2,GYB2),       ⎫
 layout(B2,FLOORB2,ROTB2,[GXB2,GYB2],        ⎪
 [RXB2,RYB2]),                               ⎬ 1060
 shape_ok(GXB2,GYB2,RXB2,2RYBS),             ⎪
 change(RX21,RY21,ROTATION,RXB2,RYB2),       ⎭
 change(GX31,GY31,ROTATION,GXB3,GYB3),       ⎫
 layout(B3,FLOORB3,ROTB3,[GXB3,GYB3],        ⎪
 [RXB3,RYB3]),                               ⎬ 1062
 shape_ok(GXB3,GYB3,RXB3,RYB3),              ⎪
 change(RX31,RY31,ROTATION,RXB3,RYB3),       ⎭
 RX is RX11,                                 ⎫
 max(RY21,RY31,RRYY),                        ⎬ 1064
 RY is.RY11+RRYY,                            ⎭
 shape_ok(GX,GY,RX,RY).                                1066
```

Program list (6) corresponds to the pattern 5720 in FIG. 23, and the explanation of lines 1100 through 1166 which resemble the lines of the list (5) will be omitted.

Program list (7) corresponds to the pattern 5730 in FIG. 23, and the explanation of lines 1200 through 1266 which resemble the lines of the list (5) will be omitted.

Program list (8) is the realization of the functions used by the programs in the program lists (1) through (7).

Line 1300 indicates that the possible rotational angles are 0° and 90°, line 1310 describes the rule of altering the vector (X, Y) in response to the rotational angle, line 1320 calculates the maximum value, line 1330 calculates the gap value between the real shape and target shape, line 1340 tests the proximity of the real shape to the target shape, lines 1350 and 1360 read the number of wirings between blocks from data of list (2), lines 1370 and 1380 update the layout result, and line 1390 indicates that the MAX value used in step 1340 is 500.

```
Program list (6)
/* florplan --- floor2 */
floor(floor2,BLOCK,ROTATION,[B1,B2],
[GX,GY],[RX,RY],[GX11,GY11,GX21,
GY21],[RX11,RY11,RX21,
RY21]):-                                              1100
 b(B1,BLCK1,AREA1,_,_),                      ⎫
                                             ⎬ 1110
 b(B2,BLIST,AREA2,_,_),                      ⎭
 GX11 is GX,                                 ⎫
 GY11 is AREA1/GX,                           ⎪
 GX21 is GX,                                 ⎬ 1120
 GY21 is AREA2/GX21,                         ⎪
 GGYY is GY11+GY21,                          ⎭
 rotation(ROTATION),                                   1150
 change(GX11,GGYY,RITATION,GGX11,GGGYY),               1152
 shape_gap_value
 (GX,GY,GGX111,GGGYY,SHAPEGAPVALUE),                   1154 floorplan(_,BLOCK,_,_,_,_,_,linelength      ⎫
 (LX),shapegap_value(SGV)),                  ⎪
 SHAPEGAPVALUE < SGV,                        ⎪
 retract1(floorplan                          ⎬ 1156
 (_,BLOCK,_,_,_,_,_,_,_)),                   ⎪
 assert1(floorplan(floor2,BLOCK,RITATION,    ⎪
 [B1,B2,], [GX,GY],_, [GX11,GY11,GX21,GY21], ⎪
 _,_,shapegap_value(SHAPEGAPVALUE))),        ⎭
 change(GX11,GY11,ROTATION,GXB1,GYB1),       ⎫
 layout(B1,FLOORB1,ROTB1,[GXB1,GYB1],        ⎬
 [RXB1,RYB1]),                               ⎭ 1158
 shape_ok(GXB1,GYB1,RXB1,RYB1),              ⎫
 change(RX11,RY11,ROTATION,RXB1,RYB1),       ⎭
 change(GX21,GY21,ROTATION,GXB2,GYB2),       ⎫
 layout(B2,FLOORB2,ROTB2,[GXB2,GYB2],        ⎬ 1160
 [RXB2,RYB2]),                               ⎭
 shape_ok(GXB2,GYB2,RXB2,RYB2),              ⎫
 change(RX21,RY21,ROTATION,RXB2,RYB2),       ⎬
 max(RX11,RX21,RX),                          ⎭
                                                       1164
 RY is RY11+RY21,
 shape_ok(GX,GY,RX,RY).
```

```
Program list (7)
/* florplan --- floor3 */
floor(floor3,BLOCK;ROTATION,[B1,B2,B3],
[GX,GY],[RX,RY],[GX11,GY11,GX12,GY12,
GX13,GY13],[RX11,RY11,RX12,RY12,RX13,RY13]):-     1200
 b(B1,BLIST1,AREA1,_,_),                     ⎫
 b(B2,BLIST2,AREA2,_,_),                     ⎬ 1210
 b(B3,BLIST3,AREA3,_,_),                     ⎭
 GX11 is GX, GY11 is AREA1/GX11,             ⎫
 GX21 is GX, GY12 is AREA2/GX12,             ⎬ 1220
 GX13 is GX, GY13 is AREA3/GX13,             ⎭
 GX11 is GY11+GY12+GY13,                     ⎫
 length2(B1,B2,B3,A1,A2,A3,                  ⎪
 AA1 is 0, AA2 is 0, AA3 (GX12*A3),          ⎬ 1240
 TOTALLENGH is AA1+AA2+AA3,                  ⎭
 rotation(ROTATION),                                    1250
 change(GX11,GY11,ROTATION,GGX11,GGGYY),                1252
 shape_gap_value
 (GX,GY,GGX11,GGGYY,SHAPEGAPVALUE),                     1254
 floorplan(_,BLOCK,_,_,_,_,_,_,_,
 linelength(LK),shapegap_value(SGV)),
```

```
Program list (7)
SHAPEGAPVALUE < SGY,
TOTALLENGTH < LK,
retract1(floorplan
(_, BLOCK,_,_,_,_,_,_,_,_)),                                    1256
assert1(floorplan(floor3,BLOCK,RITATION,
[B1,B2,B3],[GX,GY],_,[GX11,GY11,GX12,GY12,
GX13,GY13],_,_,linelength(TOTALLENGTH)
shapegap_value(SHAPEGAPVALUE))),
change(GX11,GY11,ROTATION,GBX11,GBY11),
layout(B1,FLOORB1,ROTB1,[GBX11,GBY11],
[RBX11,RBY11]),                                                  1258
shape_ok(RX11,RY11,RBX11,RBY11),
change(RX11,RY11,ROTATION,RBX11,RBY11),
change(GX12,GY12,ROTATION,GBX12,GBY12),
layout(B2,FLOORB2,ROTB2,[GBX12,GBY12],
[RBX12,RBY12]),                                                  1260
shape_ok(GBX12,GBY12,RBX12,RBY12),
change(RX12,RY12,RBX12,RBX12), change(GX13,GY13,ROTATION,GBX13,GBY13),
layout(B3,FLOOR3,ROTB3,[GBX13,GBY13],
[RBX13,RBY13]),                                                  1262
shape_ok(GBX13,GBY13,RBX13,RBY13),
change(RX13,RY13,RBX13,RBX13), max(RX11,RX21,RX1112),
max(RX1112,RX13,RX),                                             1264
RY is RY11+RY12+RY13,
shape_ok(GX,GY,RX,RY).                                           1266
```

```
Program list (8)
rotation(0).
                                                                 1300
rotation(90).
change(X,Y,0,X,Y) :- !.
                                                                 1310
change(X,Y,90,Y,X):-!
max(X,Y,X) :- X >=Y ,!.
                                                                 1320
max(X,Y,X) :-!.
shape_gap_value(GX,GY,RX,RY,0) :- GX >= RX,
GY >= RY ,!.
shape_gap_value(GX,GY,RX,RY,V) :- GX < RX,
GY >= RY, V is (RX*100)/GX ,!.
shape_gap_value(GX,GY,RX,RY,V) :- GX >= RX,  1330
GY < RY, V is (RX*100)/GX ,!.
shape_gap_shape
(RX*100)/GX + (RY*100)/GY
shape_ok(GX,GY,RX,RY) :
- shape_gap_value(GX,GY,RX,RY,VALUE),        1340
max_shape_gap_value(MAX),VALUE =< MAX.
length1(B1,B2,B3,A1,A2,A3):-
((c(B1,B2,A1);c(B2,B1,A1);A1 is 0),
(c(B2,B3,A2);c(B3,B2,A2);A2 is 0),           1350
(c(B1,B3,A3);c(B3,B1,A3);A3 is 0)),!.
lensth2(B1,B2,B3,A1,A2,A3):-
((c(B1,B2,A1);c(B2,B1,A1);A1 is 0),
(c(B2,B3,A2);c(B3,B2,A2);A2 is 0)
(c(B1,B3,A3);c(B3,B1,A3);A3 A3);c(B3,B1,A3);AS is  1360
0)),!.
assert1(X):-assert(X),!.                     1370
retract1(X);-retract(X),!.                   1380
max_shape_sap_value(500).                    1390
```

The circuit of FIG. 20 is expressed in the program lists (1) and (2), and the program list (3) is given the instruction 650 for execution. Then, the pattern libraries of lists (4) through (8) are used repeatedly, and consequently a layout plane can be obtained in the file 5240 in FIG. 21.

Figure 25:
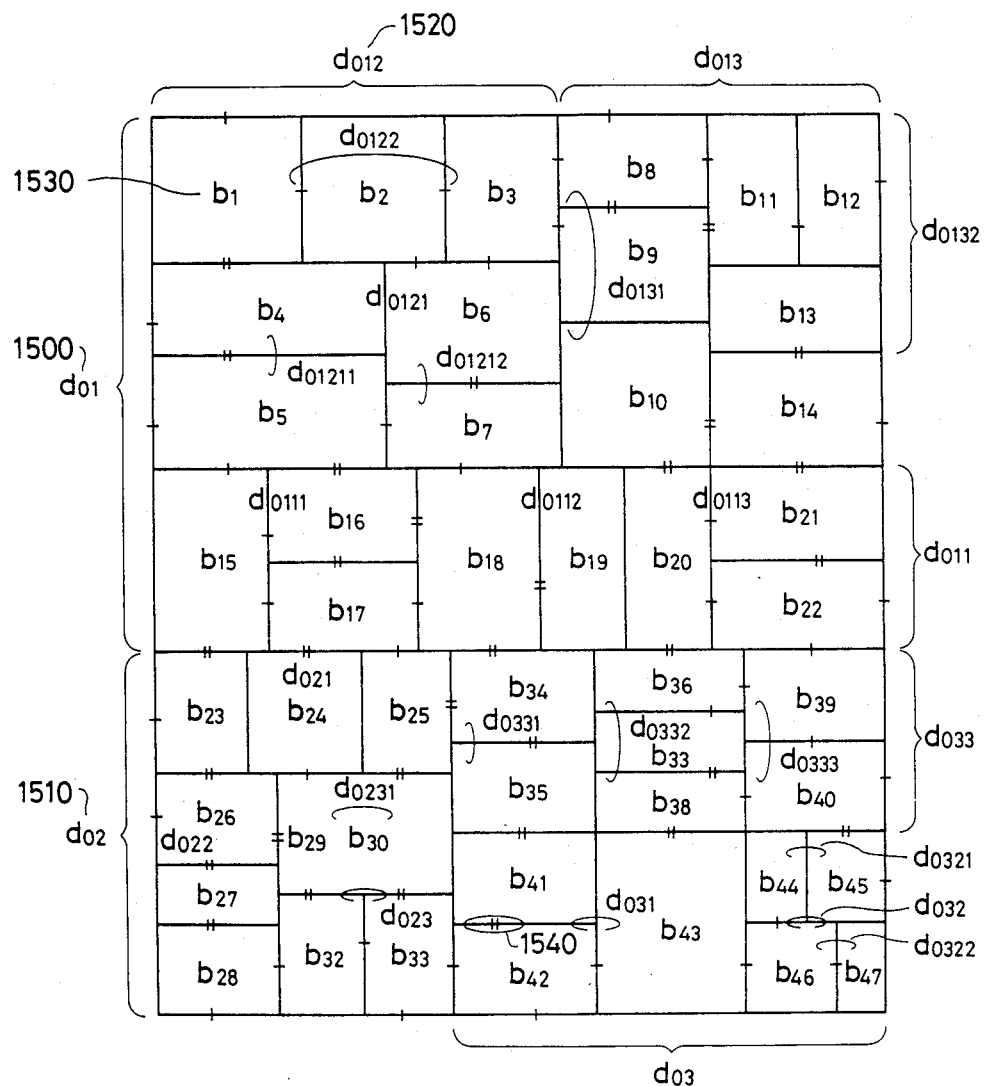
FIG. 25 is an explanatory illustration showing the results of layout obtained by the method according to the present invention.

FIG. 25 illustrates the resultant layout plan. The overall layout represents 'do', in which do1 is allocated in portion 1500, do2 is allocated in portion 1510, do12 is in portion 1520, and b1 is in portion 1530. Symbol 1540 indicates that two wirings are made between b41 and b42.

An embodiment of this invention for carrying out the above computational processes using a large scale computer has been described, and several modifications are possible, such as dividing the inventive process into blocks so that each block is treated by a microprocessor, or implementing the process with a speciality computer.

As described above, the fifth embodiment of this invention provides the efficient solution of large scale layout problems involving complex restictive conditions among objects.

Figure 26:
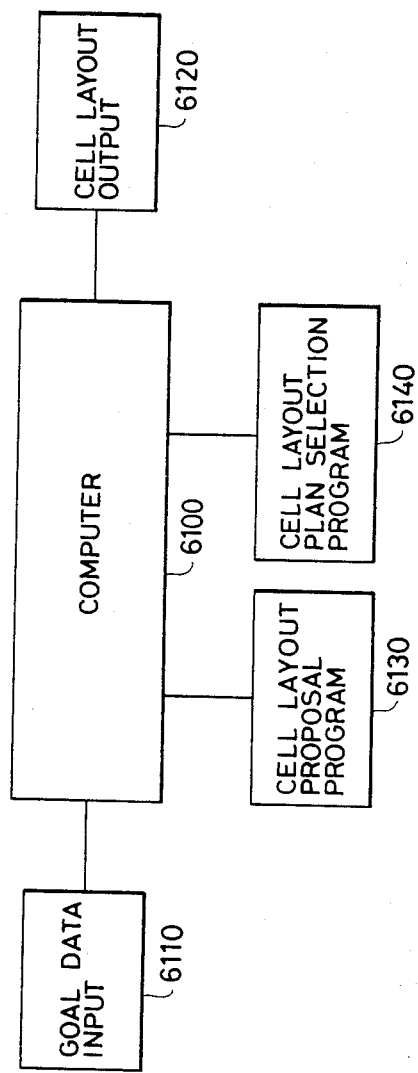
FIG. 26 is a block diagram showing the functions of an production system for producing electronic circuit layout, in a sixth embodiment, according to the present invention.

The following describes the sixth embodiment of this invention with reference to the drawings. FIG. 26 is a functional block diagram showing the automatic electronic circuit layout system, i.e., the cell library, embodying the invention. Reference number 6100 denotes a computer which stores a program 6130 for generating cell layout plans and a program 6140 for selecting a plan which meets the condition from among the cell layout plans. By entering the restrictive conditions pertaining to the characteristics and shape of cells through the goal data input unit 6110, a cell layout selected by the selection program 6140 is brought out through the cell layout output unit 6120.

As mentioned previously, the parts layout for analog for analog circuitries varies depending on the electrical characteristics of parts and the shape of layout spaces. The computer 6100 shows in FIG. 26 realizes a comprehensive cell library by storing a cell layout generation program 6130 for generating the cell layout organically and a program 6140 for selecting a cell which meets the purpose and restriction from among the generated layout shapes. Namely, different from the conventional standard cell system in which the cell shape is fixed, the cell shape can be determined promptly using the programs 6130 and 6140 by setting the target values pertaining to the electrical characteristics and shape.

Figure 27:
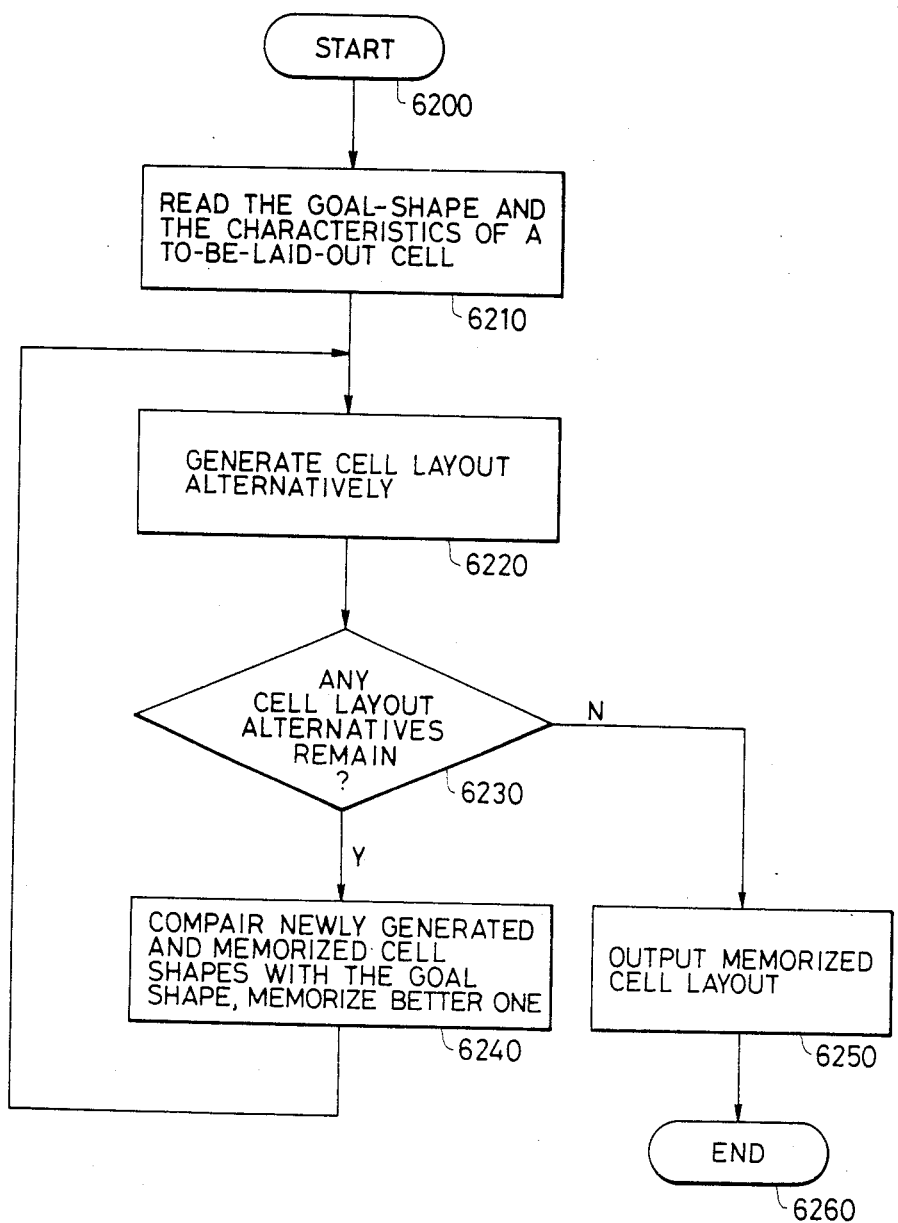
FIG. 27 a flow chart showing the processes of the program of system of FIG. 26.

FIG. 27 is a flowchart showing the processing of the program shown in FIG. 26. Initially, when the goal specifications and goal shape are entered through the goal data input unit 6110, the cell layout proposal program 6130 generates cell shapes sequentially and organically (steps 6210, 6220). The cell layout plan selection program 6140 compares the generated cell shapes with the already generated shape plan, and stores whichever more consistent to the goal (step 6240). This operation is repeated until all candidates are tries so that a cell shape which is most consistent with the goal is stored (step 6230). After the selecting process has completed, the stored cell shape most consistent to the goal is retrieved and outputted through the cell layout output unit 6120 (step 6250).

Figure 28:
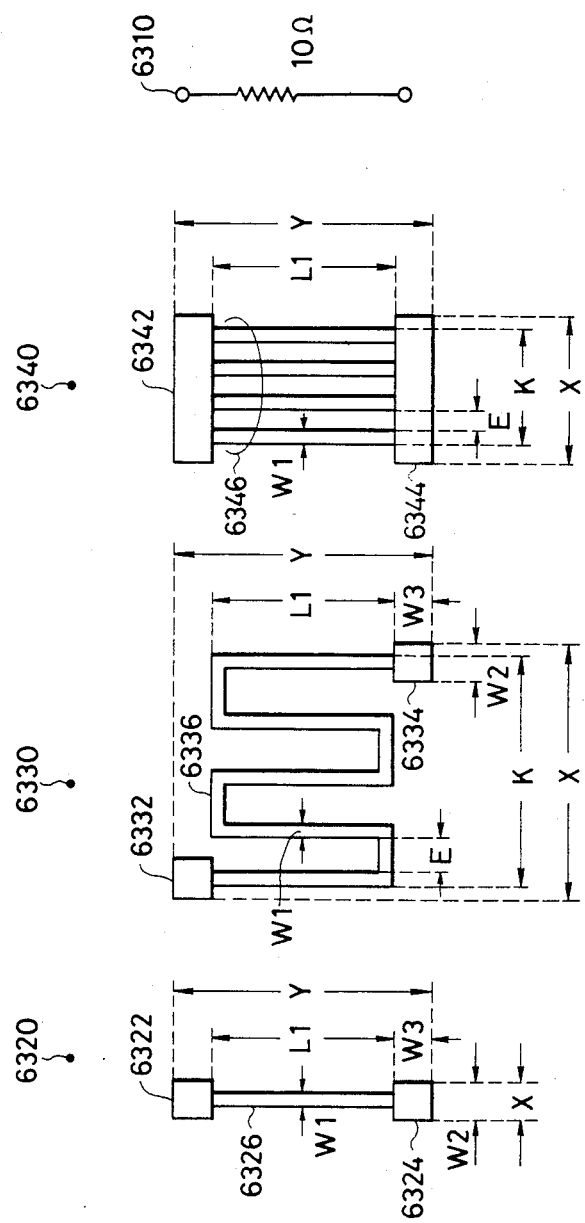
FIG. 28 is an explanatory illustration of an example employing a resistance layout shape as a cell shape.

FIG. 28 is a set of diagrams used to explain the application of this invention in determining the layout shape of a resistor, the simplest component used in the analog circuit. The resistor to be laid out is symbolized as shown by 6310, and is assumed to have a resistance of 10Ω. In designing a layout for this resistor 6310, various patterns including a linear type 6320, bend type 6330, parallel type 6340, and so on may be used. When the layout of a resistor is intended to produce in LSI, one of the patterns 6320–6340 most consistent with the goal will be selected in consideration of the resistance which characterized the resistor 6310 and the shape of space where it is laid, and the detailed shape of the pattern will be determined.

In FIG. 28, sections 6322, 6324, 6332, 6334, 6342 and 6344 are called "contacts", whole sections 6326, 6336 and 6346 are resistor bodies which are generally formed by a diffusion layer on the wafer. The contact is used to connect the diffusion layer to the upper wiring layer.

The layout shape is defined by the outside dimensions X and Y, the length of element (resistor body) L1, the width of element W1, the base length of contact W2, the height of contact W3, the spacing of elements E, and the number of repetitions of pattern K, as shown in FIG. 28. The variable K has such a value of K=2 for the pattern 6330 of FIG. 28, or K=4 for the pattern 6340.

In this embodiment, the resistance and the goal shape are given to select one of the three patterns which best meets the goal, and to determine the detailed shape of the pattern.

FIG. 29 is a layout diagram of a wafer to which this invention is applied, and FIG. 30 is a set of diagrams showing the application of this invention for combining cells. In LSI technology, a group of resistors, capacitors, transistors, etc. and the combination thereof is termed "cell". On the wafer 41 shown in FIG. 29, a hatched portion 42 is already used to lay a cell, and this invention is conveniently be applied to place resistors in a vacant area of a by b.

In addition to discrete components such as resistors, this invention is effective for layout shapes of components in a hierarchical arrangement in which a master part includes slave parts by generating various layout shapes of slave parts so that the final characteristics and shape of the master part well matches the goal. For example, in generating a layout of a differential amplifier as shown in FIG. 30(a), the amplifier is segmented into transistors Q1 and Q2, and resistors R1 and R2 to form cells 651 through 654, and these cells are assembled so that the complete amplifier is consistent in the characteristics and shape with the goal. Accordingly, by the provision of the program 6130 for generating layouts of various cells sequentially, a layout shape for a master part including several slave parts can be configured to meet the goal.

FIG. 31 is an explanatory diagram for the input and output program in the inventive cell library. In this embodiment, a logic programming language is used to describe the program. The logic programming language is designed for use in the fifth generation computer, as described in detail in "Clocksin & Mellish 81; Programming in Prolog, Springer-Verlag, 1981", for example.

FIG. 31 shows as an example program segments corresponding to the goal data input unit 6110 and cell layout output unit 6120 in FIG. 26. Line 6400 is an input instructing the generation of cell layout for a resistor having a resistance of '1000' and dimensions of '5' by '50'. Line 6402 is the corresponding output instructing that a shape "type 1" (patterns 6320, 6330 and 6340 of FIG. 28 are named expediently as type 1, type 2 and type 3, respectively) be made to have X=5, Y=60, L1=50, W1=1, W2=5, and W35. Similarly, lines 6404 and 6406 given a certain set of input and output. In this case, the shape of type 2 is outputted as X=17, Y=18, L1=8, W1=1, W2=5, W3=5, K=2, and E=2. Lines 6408 and 6410 give an example of the output for the shape of type 3 indicating X=11, Y=11, L1=1, W1=1, W2=11, W3=5, K=3, and E=2. (Although inthis embodiment the experiment was conducted using a logic programming language having only the integer processing function, resulting in the inclusion of truncation error in part of the output, such a problem is overcome by running the program using a logic programming language capable of real number processing.)

FIGS. 32 and 33 are explanatory diagrams for the inventive cell layout proposal program. Line 6500 of FIG. 32 represents that the contacts are dimensioned to be 5 by 5, line 6510 represents that the element with a width '1' running for a length of 1 unit on the diffusion layer has a resistance of 20 units. Line 6520 indicates that a resistor created on the diffusion layer has a width of 2 units. Line 6530 and successive lines indicate that a maximum of 10 repetitions are possible in the arrangements of patterns 6330 and 6340 in FIG. 28.

FIG. 33 is a set of programs for creating the shape of resistors using data given in FIG. 32. A line block starting with 6600 is a program for creating the pattern of type 1, a line block from 6610 is a program for type 2, and a line block from 6640 is a program for type 3. Line 6602 is a section for making an assumption of the contact size in the data of FIG. 32, line 6604 includes a section for making an assumption for the width of the resistor wire, and the section for calculate the values of L1, X and Y basing on these assumptions. Line 6600 is a program involving the resistance "ohm" as an input variable and X, Y, L1, W1, W2 and W3 as output variables.

FIG. 34 is an explanatory diagram for the inventive cell layout plan selection program. The cell layout plan selection program 6140 selects one of generated cell layout shapes which matches the purpose, and provides it as a final plan. Line 6700 is a program which enters resistance Ohm and goal shape X-Obj, Y-Obj, and outputs Ans. Line 6702 is a section of storing a dummy shape plan for the comparison on line 6240. Line 6704 is a section for creating a layout shape plan for the resistor using the program of FIG. 33. Line 6706 is a section of analyzing the difference between the created shape and the goal shape. Line 6708 is a section of comparing the already created plan with the newly created plan and storing one much consistent with the goal. Line 6710 is a section of creating alternative shape plans for all. The sequence returns to line 6700 to repeat the above operations. Line 6740 is a program for outputting the final result, and it corresponds to step 2650 in FIG. 27. Lines 6760, 6780 and 6790 are partial programs used in the programs 6700, 6740 and 6760.

The conventional standard cell system, when intended to apply to the layout of analog circuits, is merely the storing of fixed shape cells and does not always provide cell optical for the circuit characteristics and the shape of part layout area, whereas the inventive method generates cell layouts to meet restrictions pertaining to the characteristics of circuit components and their layout areas.

According to the sixth embodiment of this invention, as described above, cell layouts for analog circuits can be generated automatically to meet the restrictions pertaining to the characteristics of circuit components and their layout areas, whereby standard cells of analog circuit can be realized.

The seventh embodiment of this invention will be described in connection with FIG. 35 showing the software organization of the inventive AOV data retrieval system. This system is realized by basic functions 7110 and AOV retrieving functions 7120. The basic functions include tree structure defining function and two more functions, and binary tree is used as the tree structure in this embodiment. These functions are named 'binary' (7132), 'delete' and 'vecall' in this embodiment.

The AOV retrieving functions includes data reading functions 7150 made up of 3-level functions such as level-1 reading function named 'fget-a'. Remaining functions are also made up of 3-level functions with respective names.

Figure 36:
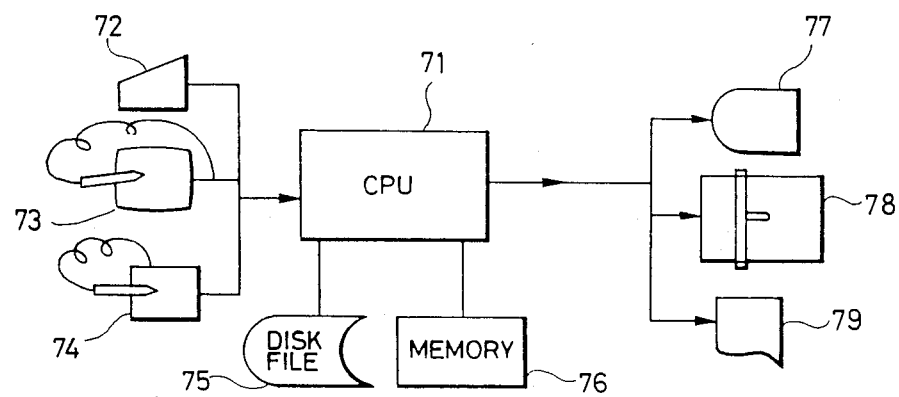
FIG. 36 is a block diagram showing a hardware environment for executing the seventh embodiment of the present invention.

FIG. 36 shows the hardware environment for carrying out this invention. Net data is entered through a keyboard 72, light pen 73 and tablet 74. The knowledge base and data base are realized using a memory unit 76 and magnetic disk file 75. The layout result and intermediate result are outputted through a display 77, plotter 78 and printer 79.

The realization of the tree structure definition functions 7132 shown in FIG. 35 is listed in the following program list (1).

| Program list (1) | |
|---|---|
| binary(t(X,K(K,Prop),Z),K(K,Prop), t(X,K(K,Prop ,Z)). | 200 |
| binary(t(X,K(Y,P),Z),K(K,Prop), t(X1,K(Y,P),Z)):- K@<Y,binary(X,K(K,Prop),X1). | 210 |
| binary(t(X,K(Y,P),Z),K(K,Prop), t(X,K(Y,P),Z1)):- K@>Y,binary(Z,K(K,Prop),Z1). | 220 |
| binary(void,K(K,Prop), t(void,K(K,Prop),void)). | 230 |

Line 200 is a function for retrieving information 'Prop' corresponding to key K from node K(K,P) in the binary tree. Line 210 is a left sub-tree retrieval function, line 220 is a right sub-tree retrieval function, and line 230 is a function for adding a new information node K(K, Prop) to the tree during the void tree retrieval. In the list, 't(X,K(K,Prop), Z)' signifies a binary tree, where X is a left sub-tree, Z is a right sub-tree and K(K, Prop) is anode having key K and information Prop. Term void signifies a void tree.

The following program list (2) shows the function used to delete information from the tree structure.

| Program list (2) | |
|---|---|
| delete(t(X,K(K,Prop),void),K,(K,Prop),X). | 300 |
| delete(t(X,K(K,Prop),t(void,Y1,Z1)), K(K,Prop),t(X,Y1,Z1)). | 310 |
| delete(t(X,K(K,Prop),t(X1,Y1,Z1)), K(K,Prop),t(X,Y,t(X2,Y1,Z1))):- successor(X1,Y,X2). | 320 |
| delete(t(X,K(Y,P),Z),K(K,Prop), t(X1,K(Y,P),Z)):- K@<Y,delete(X,K(K,Prop),X1. | 330 |
| delete(t(X,K(Y,P),Z),K(K,Prop),t(X,K(Y,P),Z1)):- K@>Y,delete(Z,K(K,Prop),Z1), | 340 |
| delete(void,K(K,Prop),void). | 350 |
| successor(t(void,Y,Z),Y,Z). | 360 |
| successor(t(X,Y,Z),Y1,t(X1,Y,Z)):- successor(X,Y1,X1). | 370 |

Line 300 indicates that deletion of node K(K, Prop) in the tree structure t(X,K(K,Prop), void) results in the remainder of X. Lines 310 through 350 are also functions for deleting information in the tree structure. Each function has a deleting method depending on the property of the tree structure, and a deleting operation is carried out separately for each case. Function 'successor' used on line 320 is a function for taking out a suc-cessor tree of one node within the tree structure, and its realization is as shown on lines 360 and 370.

The tree structure retrieval function in FIG. 35 is listed in program list (3).

| Program list (3) | |
|---|---|
| recall(Key,Dictionary,Ans):- binary(Dictionary,K(Key,Ans),_), | 400 |

Line 400 is a function for finding a node having key 'Key' in the local variable dictionary and outputting its content to 'Ans'. The function uses on its right side the above-mentioned binary function.

The realization of the AOV retrieval function in FIG. 35 is listed in the following program list (4).

| Program list (4) | |
|---|---|
| fset_a(A,Ans,Dic):-recall(A,Dic,Ans). | 500 |
| fset_a_o(A,O,Ans,Dic):-recall(A,Dic,Int), recall(O,Int,Ans), | 505 |
| fset_a_v(A,O,V,Ans,Dic):- fset_a_o(A,O,Dic1,Dic), fset_a(V,Ans,Dic1). | 510 |
| fput_a(A,In,Dicold,Dicnew):- binary(Dicold,K(A,In),Dicnew). | 515 |
| fput_a_o(A,O,In,Dicold,Dicnew):- delete(Dicold,K(A,Ans),Dic1), fput_a(O,In,Ans,Ansnew), fput_a(A,Ansnew,Dic1,Dicnew). | 520 |
| fput_a_o_v(A,O,Ansg,Dicold,Dicnew):- fdel_a(A,Ansl,Dicold,Dic1), fput_a_o(O,v,Ans,Ans1,Ans2), fput_a(A,Ans2,Dic1,Dicnew). | 525 |
| fdel_a(A,Ans,Dicold,Dicnew):- delete(Dicold,K(A,Ans),Dicnew). | 530 |
| fdel_a_o(A,O.Ans,Dicold,Dicnew):- delete(Dicold,K(A,Int),Dicl), delete(Int,K(O,Ans),Int2), fput_a(A,Int2,Dic1,Dicnew). | 535 |
| fdel_a_o_v(A,O,V,Ans,Dicold,Dicnew):- fdel_a(A,Ans1,Dicold,Ans2), fdel_a_o(O,V,Ans,Ans1,Ans3), fput_a(A,Ans3,Ans2,Dicnew). | 540 |
| fchanse_a(A,Iold,Inew,Dicold,Dicnew):- fdel_a(A,Iold,Dicold,Dic1), fput_a(A,Inew,Dicl,Dicnew). | 545 |
| fchanse_a_o(A,O,Iold,Inew,Dicold,Dicnew):- fdel_a_o(A.O,Iold,Dicold,Dic1), fput_a_o(A,O,Inew,Dic1,Dicnew). | 550 |
| fchanse_a_o_v(A,O,V,Iold,Inew, Dicold,Dicnew):- fdel_a(A,Ans1,Dicold,Ans2, fchanse_a_o(O,V,Iold,Inew,Ans1,Ans3), fput_a(A,Ans3,Ans2,Dicnew). | 555 |

Line 500 is a function for taking out information by the single-level key "A" from among tree structure local variables 'Dic' into 'Ans'. Line 505 takes out information by two-level keys 'A' and 'O' into 'Ans' Line 506 takes out information corresponding to three-level keys 'A', 'O' and 'V'. Line 515 is a function for transforming an old tree 'Dicold' with the entry of information 'In' corresponding to key 'A' into a new tree 'Dicnew'. Lines 520 and 525 are functions with 2-level and 3-level keys. Lines 530 through 540 are functions for deleting part of the tree structure, and lines 545 through 555 are functions for changing part of the tree structure.

The following program list (5) shows samples of using the functions in the program list (4).

| Program list (5) |
|---|
| \|?-fput_a_o_v(trl,base_diff,shape,[4,5],Dic1,Dic2), |

-continued

| Program list (5) | |
|---|---|
| fset__a__o__v(trl,bass__diff,shape,Ans,Dic2).<br>Ans=[4,5]. | 600<br>610 |
| \|?fput__a__o__v(trl,base__diff,shape,[4,5],Dic1,Dic2),<br>fchanse__a__o__v(trl,base__diff,shape,__,[6,8],<br>Dic2,Dic3), fset__a__o__v(trl,base__diff,shape,<br>Ans,Dic3).<br>Ans=[6,8] | 620<br>630 |

Line 600 signifies that information indicating the base diffusion layer (base-diff) of a transistor (tr1) being in a shape of [4,5] is added to the tree structure 'Dic1' to form a new tree structure Dic2, and thereafter inquiry is made again as to "what is the shape of base-diff of tr1", resulting in an reply of Ans=[4,5]. Line 620 is an example of storing the same information in the tree structure 'Dic2' and, thereafter, changing the shape [4,5] to [6,8], and confirming whether the change has been made correctly. Correct change is shown on line 630.

As described above, the reason that the inventive system can be realized on the logic language without deteriorating the efficiency of retrieval is formation of a tree structure with satisfactory retrieval efficiency on the logic language and realization of the AOV retrieval system using it.

As described above, this invention enables a significant speedup of retrieving, input modifying and updating graphic information used in CAD systems, data base of design information and knowledge base though the use of the conventional language. The application of this invention ranges extensively in fields involving data transactions, such as translation, recognition and rule processing, in which enhancement of efficiency is expected.

This invention realizes the AOV retrieval system on logic languages such as Prolog which is said to become important in the CAD system and the like in the future without deteriorating the retrieving efficiency although it has been questionable to realize it on such languages from the viewpoint of retrieving efficiency. The invention enables an incomparable speedup as compared with the conventional case of converting the program itself into a program which uses global variables.

When a large number of complex shapes are stored in the computer system and optimal one is selected by trying several layout plans for a set of shapes, as is commonly seen the layout CAD system, it is desirable that both of the alternative search function possessed by the logic language and the shape expression ability possessed by the AOV retrieval system.

This invention accomplishes the purpose.

We claim:

1. Pattern understanding method comprising a step of storing in a memory structural patterns of fundamental net data of electronic circuits; and a step of searching the memory for fundamental net data which matches said structural patterns.

2. A method according to claim 1 further comprising a step of defining partial circuits using nonterminal symbols defined recursively and storing the defined circuits; a step of extracting a circuit which matches said definition by searching the entered circuit recursively using the output node thereof as an input node; and a step of recognizing and extracting a signal propagation route based on said extracted circuit.

3. A circuit pattern layout method implemented under provision of elements of an electronic circuit to be laid out, specifications of said elements and information of wiring among said elements, said method comprising a step of understanding a higher-level structure realized by an assembly of elements from said element and wiring information, and a step of generating a layout shape corresponding to said understood higher-level structure.

4. A circuit pattern layout method for automatically laying out a system including objects to be laid out and wirings among said objects, said method comprising a step of memorizing layout patterns which hold layout positions of said objects and wiring routes among said objects; and a step of allocating a layout system on said layout positions and wiring routes using said memorized patterns.

5. An electronic circuit layout method involving a first program for generating organically layout shapes of an electronic component and a second program for selecting a shape which meets a given condition from among said generated layout shapes, characterized in that goal characteristics and goal shape of said electronic component are entered, said first program is initiated to generate cell shapes organically, each generated shape is compared with an already generated shape plan by said second program, one of shapes which matches said input goal is memorized, and said memorized shape plan is outputted.

6. A method according to claim 1, wherein a plurality of patterns including linear type, bend type and parallel type are used as a layout shape when said electronic component is a resistor.

7. A method according to any one of claims 1, 3, 4 or 5, wherein a logic language has local variables provided with information in tree structure, said logic language including basic functions for implementing transaction on tree structure such as information retrieval, information entry and information alteration and a series of functions for implementing information transaction on tree structure based on key word using said basic functions.

8. A circuit pattern understanding system comprising a means for expressing the structure of subcircuits using symbols of elements and nonterminal symbols defined recursively by the elements based on net data of an electronic circuit, and a means for recognizing and extracting a functionally significant subcircuit through the search of said subcircuit.

* * * * *